United States Patent
Harada et al.

(10) Patent No.: US 11,227,966 B2
(45) Date of Patent: Jan. 18, 2022

(54) PHOTOELECTRIC CONVERSION DEVICE

(71) Applicant: SHARP KABUSHIKI KAISHA, Sakai (JP)

(72) Inventors: Masatomi Harada, Sakai (JP); Toshihiko Sakai, Sakai (JP); Rihito Suganuma, Sakai (JP); Kazuya Tsujino, Sakai (JP); Tokuaki Kuniyoshi, Sakai (JP); Takeshi Kamikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 74 days.

(21) Appl. No.: 15/302,644

(22) PCT Filed: Apr. 3, 2015

(86) PCT No.: PCT/JP2015/060655
§ 371 (c)(1),
(2) Date: Oct. 7, 2016

(87) PCT Pub. No.: WO2015/156233
PCT Pub. Date: Oct. 15, 2015

(65) Prior Publication Data
US 2017/0033252 A1    Feb. 2, 2017

(30) Foreign Application Priority Data

Apr. 11, 2014  (JP) ............................. JP2014-081526
Apr. 11, 2014  (JP) ............................. JP2014-081527

(51) Int. Cl.
*H01L 31/075* (2012.01)
*H01L 31/18* (2006.01)
(Continued)

(52) U.S. Cl.
CPC .... *H01L 31/075* (2013.01); *H01L 31/022441* (2013.01); *H01L 31/03762* (2013.01);
(Continued)

(58) Field of Classification Search
None
See application file for complete search history.

(56) References Cited

U.S. PATENT DOCUMENTS

| 4,379,943 A * | 4/1983 | Yang ..................... H01L 31/075 |
|---|---|---|
| | | 136/249 |
| 2002/0069911 A1 | 6/2002 | Nakamura et al. |
| 2011/0088760 A1 * | 4/2011 | Sheng ............... H01L 21/02576 |
| | | 136/255 |

FOREIGN PATENT DOCUMENTS

| JP | 2002-076409 | 3/2002 |
| JP | 2005-101239 | 4/2005 |
| WO | WO 2014/050304 | 4/2014 |

OTHER PUBLICATIONS

International Search Report for PCT/JP2015/060655 dated Jun. 30, 2015, 2 pages.

* cited by examiner

*Primary Examiner* — Shannon M Gardner
(74) *Attorney, Agent, or Firm* — ScienBiziP, P.C.

(57) ABSTRACT

Provided is a photoelectric conversion device capable of suppressing diffusion of a dopant in a p layer or n layer into an adjacent layer. A photoelectric conversion device is provided with a silicon substrate, a substantially intrinsic amorphous layer formed on one surface of the silicon substrate, and a first conductive amorphous layer that is formed on the intrinsic amorphous layer. The first conductive amorphous layer includes a first concentration layer and a second concentration layer that is stacked on the first concentration layer. The dopant concentration of the second (Continued)

concentration layer is $8\times10^{17}$ cm$^{-3}$ or more, and is lower than the dopant concentration of the first concentration layer.

5 Claims, 27 Drawing Sheets

(51) Int. Cl.
    *H01L 31/0747*     (2012.01)
    *H01L 31/0224*     (2006.01)
    *H01L 31/0376*     (2006.01)
(52) U.S. Cl.
    CPC ...... *H01L 31/0747* (2013.01); *H01L 31/1804* (2013.01); *Y02E 10/547* (2013.01); *Y02P 70/50* (2015.11)

PHOTOELECTRIC CONVERSION DEVICE

This application is the U.S. national phase of International Application No. PCT/JP2015/060655 filed 3 Apr. 2015 which designated the U.S. and claims priority to JP Patent Application No. 2014-081527 filed 11 Apr. 2014 and JP 2014-081526 filed 11 Apr. 2014, the entire contents of each of which are hereby incorporated by reference.

TECHNICAL FIELD

The present invention relates to a photoelectric conversion device that converts light into electricity. The photoelectric conversion device in the specification is a device with a wide concept that includes a photoelectric conversion element, a photoelectric conversion module that uses the photoelectric conversion element, and a solar power generation system provided with the photoelectric conversion module.

BACKGROUND ART

In the related art, a configuration of a photoelectric conversion element in which an intrinsic amorphous layer is disposed at a pn junction is known.

Japanese Unexamined Patent Application Publication No. 2002-76409 discloses a photovoltaic device in which a thin intrinsic amorphous semiconductor film is disposed at the junction between a crystalline semiconductor substrate and an amorphous semiconductor film having a relationship of mutually opposite conductivity types. The photovoltaic device has an optical band gap of the intrinsic amorphous semiconductor film that widens on the side that contacts the amorphous semiconductor film.

SUMMARY OF INVENTION

The intrinsic amorphous layer disposed at the pn junction suppresses the generation of a recombination level in the pn junction. However, there are cases where the dopant in the p layer or the n layer diffuses into the adjacent intrinsic amorphous layer or electrode due to a heating process or the like in the manufacturing process. When the dopant diffuses into the intrinsic amorphous layer or the electrode, the recombination level increases and the conversion efficiency decreases. Meanwhile, when a nitride film or oxide film is disposed between the layers in order to suppress diffusion of the dopant, the short-circuit current is lowered, and the conversion efficiency is lowered.

An object of the invention is to provide a photoelectric conversion device capable of suppressing diffusion of a dopant in a p layer or n layer into an adjacent layer.

The photoelectric conversion device disclosed herein is provided with a silicon substrate, a substantially intrinsic amorphous layer that is formed on one surface of the silicon substrate, and a first conductive amorphous layer that is formed on the intrinsic amorphous layer. The first conductive amorphous layer includes a first concentration layer and a second concentration layer that is stacked on the first concentration layer. The dopant concentration of the second concentration layer is $8 \times 10^{17}$ cm$^{-3}$ or more, and is lower than the dopant concentration of the first concentration layer.

According to the above-described configuration, the photoelectric conversion device is provided with a silicon substrate and a first conductive amorphous layer. An intrinsic amorphous layer is formed between the silicon substrate and the first conductive amorphous layer. The intrinsic amorphous layer suppresses the generation of a recombination level in the junction between the silicon substrate and the first conductive amorphous layer. The first conductive amorphous layer includes a second concentration layer that is stacked on the first concentration layer. The dopant concentration of the second concentration layer is lower than the dopant concentration of the first concentration layer. The diffusion of the dopant from the first concentration layer into another layer can be suppressed by the second concentration layer. The lowering of the shape factor can be suppressed by making the dopant concentration of the second concentration layer $8 \times 10^{17}$ cm$^{-3}$ or more. Thereby, the conversion efficiency of the photoelectric conversion device can be improved.

Another photoelectric conversion device disclosed herein is provided with a silicon substrate, a substantially intrinsic amorphous layer formed on one surface of the silicon substrate, and a first conductive amorphous layer that is formed on the intrinsic amorphous layer. The first conductive amorphous layer includes a first concentration layer and a second concentration layer that is stacked on the first concentration layer. The conductivity type of the first conductive amorphous layer is p-type and the second concentration layer contains a p-type dopant and an n-type dopant.

According to the above-described configuration, the photoelectric conversion device is provided with a silicon substrate and a first conductive amorphous layer. An intrinsic amorphous layer is formed between the silicon substrate and the first conductive amorphous layer. The intrinsic amorphous layer suppresses the generation of a recombination level in the junction between the silicon substrate and the first conductive amorphous layer. The first conductive amorphous layer includes a second concentration layer that is stacked on the first concentration layer. The second concentration layer contains a p-type dopant and an n-type dopant. The diffusion of the dopant from the first concentration layer into another layer can be suppressed by the second concentration layer. Thereby, the conversion efficiency of the photoelectric conversion device can be improved.

DESCRIPTION OF EMBODIMENTS

Embodiments

Figure 1:
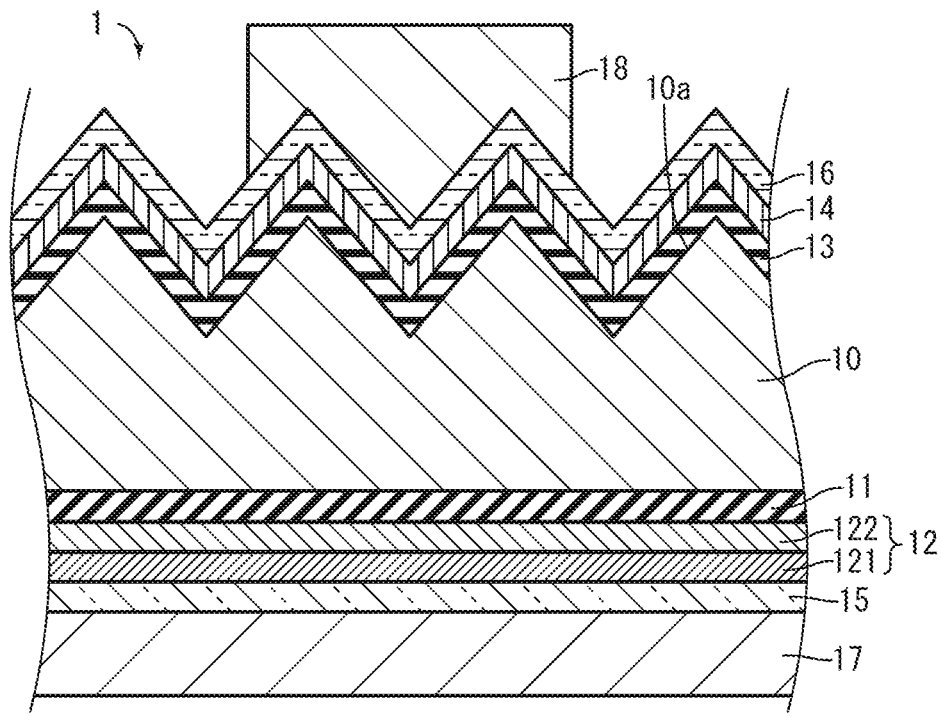
FIG. 1 is a cross-sectional view schematically illustrating a configuration of a photoelectric conversion element according to a first embodiment of the invention.

Embodiments of the invention will be described below with reference to the drawings. The same references are applied to the same or corresponding portions in the drawings, and description thereof will not be repeated. For ease of the description, the configurations are illustrated simplified or schematically in the drawings referenced below, and a portion of the constituent members is not illustrated. The dimensional ratios between the constituent members illustrated in each of the drawings, and the actual dimensional ratios are not necessarily illustrated.

First Embodiment

FIG. 1 is a cross-sectional view schematically illustrating a configuration of a photoelectric conversion element 1 according to a first embodiment of the invention. The photoelectric conversion element 1 is provided with a substrate 10 (silicon substrate), intrinsic amorphous layers 11 and 13, a p-type amorphous layer 12 (first conductive amorphous layer), an n-type amorphous layer 14 (second conductive amorphous layer), transparent conductive films 15 (conductive film) and 16, and electrodes 17 and 18.

It should be noted that, in the specification, a microcrystalline layer may be included in the amorphous layer. The wording "microcrystalline layer" is a layer in which the average particle diameter of the crystals precipitated in the amorphous layer is 1 to 50 nm.

The substrate 10 is single crystal silicon substrate with an n-type conductivity type. The thickness of the substrate 10 is 80 to 200 μm. The specific resistance of the substrate 10 is 1 to 4 Ωcm. A texture is formed on one surface 10a of the substrate 10. The texture lowers the surface reflectivity of the substrate 10.

The intrinsic amorphous layer 13, n-type amorphous layer 14, transparent conductive film 16, and electrode 18 are formed in this order from the substrate 10 side on the surface 10a of the substrate 10. The intrinsic amorphous layer 11, p-type amorphous layer 12, transparent conductive film 15, and electrode 17 are formed in this order from the substrate 10 side on the surface of the opposite side to the surface 10a.

The intrinsic amorphous layers 11 and 13 are films of an amorphous semiconductor layer that are substantially intrinsic and contain hydrogen. The intrinsic amorphous layers 11 and 13 are formed of an i-type amorphous silicon, an i-type amorphous silicon germanium, an i-type amorphous germanium, an i-type amorphous silicon carbide, an i-type amorphous silicon nitride, an i-type amorphous silicon oxide, an i-type amorphous silicon carbon oxide, and the like. The thickness of the intrinsic amorphous layers 11 and 13 is several Angstroms to 25 nm.

The n-type amorphous layer 14 is a film of an amorphous semiconductor that has an n-type conductivity type and that contains hydrogen. The n-type amorphous layer 14 contains phosphorous (P) as a dopant. The dopant concentration of the n-type amorphous layer 14 is $1 \times 10^{18}$ to $1 \times 10^{20}$ cm$^{-3}$. The n-type amorphous layer 14 is formed of an n-type amorphous silicon, an n-type amorphous silicon germanium, an n-type amorphous germanium, an n-type amorphous silicon carbide, an n-type amorphous silicon nitride, an n-type amorphous silicon oxide, an n-type amorphous silicon carbon oxide, and the like. The thickness of the n-type amorphous layer 14 is 2 to 50 nm.

The p-type amorphous layer 12 is a film of an amorphous semiconductor that has a p-type conductivity type and that contains hydrogen. The p-type amorphous layer 12 includes a p layer 121 (first concentration layer) and a p⁻ layer 122 (second concentration layer) that are stacked. In the embodiment, the p layer 121 and the p⁻ layer 122 are formed in the order of p⁻ layer 122 and p layer 121 from the substrate 10 side. That is, the p⁻ layer 122 is formed on the intrinsic amorphous layer 11, and the p layer 121 is formed on the p⁻ layer 122.

The p layer 121 and the p⁻ layer 122 contain boron (B) as the dopant. The p layer 121 and the p⁻ layer 122 differ from one another in dopant concentration. More specifically, the dopant concentration of the p⁻ layer 122 is $8 \times 10^{17}$ cm$^{-3}$ or more, and is lower than the dopant concentration of the p layer 121. The dopant concentration of the p layer 121 is $1 \times 10^{20}$ to $1 \times 10^{21}$ cm$^{-3}$.

The p layer 121 and the p⁻ layer 122 are formed of a p-type amorphous silicon, a p-type amorphous silicon germanium, a p-type amorphous germanium, a p-type amorphous silicon carbide, a p-type amorphous silicon nitride, a p-type amorphous silicon oxide, a p-type amorphous silicon carbon oxide, and the like. The thicknesses of the p layer 121 and the p⁻ layer 122 are each 2 to 50 nm.

The transparent conductive films 15 and 16 are transparent conductive oxides (TCO), and, more specifically, are films of indium tin oxide (ITO), $SnO_2$, ZnO, or the like. The thicknesses of the transparent conductive films 15 and 16 are 70 to 100 nm.

The electrodes 17 and 18 are resin compositions into which a conductive filler such as silver powder is kneaded.

[Method of Manufacturing Photoelectric Conversion Element 1]

An example of the method of manufacturing the photoelectric conversion element 1 will be described with reference to FIGS. 2A to 2E.

Figure 2A:
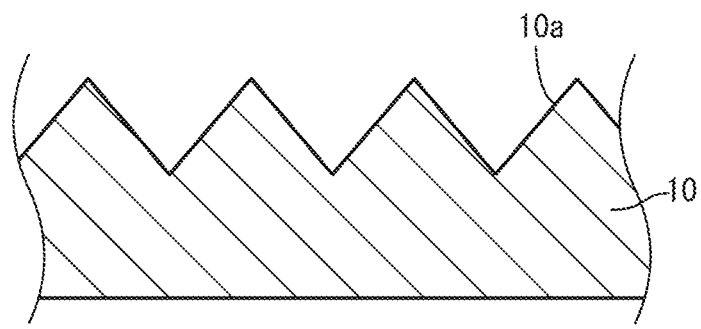
FIG. 2A is a drawing illustrating an example of a method of manufacturing the photoelectric conversion element.

A texture is formed on the surface 10a of the substrate 10 (FIG. 2A). It is possible to form the texture by anisotropic etching using an alkali solution.

Figure 2B:
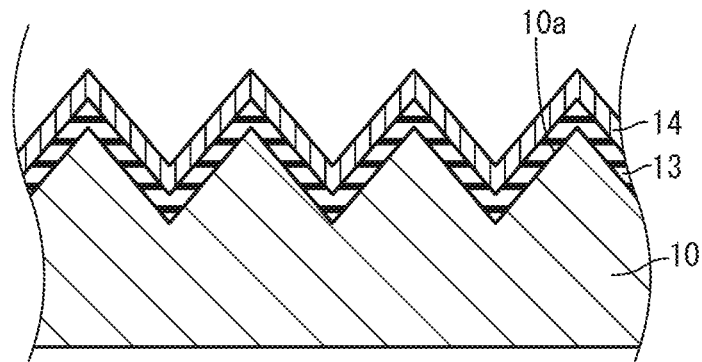
FIG. 2B is a drawing illustrating an example of the method of manufacturing the photoelectric conversion element.

The intrinsic amorphous layer 13 and the n-type amorphous layer 14 are formed on the surface 10a of the substrate 10 (FIG. 2B). It is possible to form the intrinsic amorphous layer 13 and n-type amorphous layer 14 by plasma chemical vapor deposition (plasma CVD).

It is possible to form a film of i-type amorphous silicon as the intrinsic amorphous layer 13 by carrying out plasma CVD in conditions of a substrate temperature of 130 to 210° C., an $H_2$ gas flow rate of 0 to 100 sccm, an $SiH_4$ gas flow rate of 40 sccm, a pressure of 40 to 120 Pa, and a high-frequency power density at 13.56 MHz of 5 to 15 mW/cm².

It is possible to form a film of n-type amorphous silicon doped with phosphorous (P) as the n-type amorphous layer 14 by carrying out plasma CVD in conditions of a substrate temperature of 170° C., an $H_2$ gas flow rate of 0 to 100 sccm, an $SiH_4$ gas flow rate of 40 sccm, a $PH_3/H_2$ gas flow rate of 40 sccm, a pressure of 40 Pa, and a high-frequency power density of 8.33 mW/cm². It should be noted that $PH_3/H_2$ gas represents a gas in which $PH_3$ is diluted by $H_2$ gas, and it is possible for the concentration of the $PH_3$ with respect to $H_2$ to be made, for example, 1%. Instead of $PH_3/H_2$ gas, a $PH_3/SiH_4$ gas in which $PH_3$ gas is diluted by $SiH_4$ may be used.

Figure 2C:
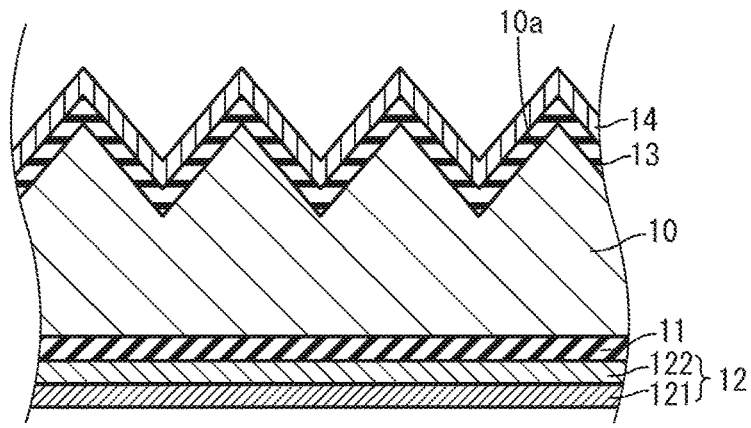
FIG. 2C is a drawing illustrating an example of the method of manufacturing the photoelectric conversion element.

The intrinsic amorphous layer 11 and the p-type amorphous layer 12 are formed in order on the surface on the opposite side to the surface 10a (FIG. 2C). It is possible to form the intrinsic amorphous layer 11 and p-type amorphous layer 12 by plasma CVD.

The formation conditions of the intrinsic amorphous layer 11 are the same as those of the intrinsic amorphous layer 13. The intrinsic amorphous layer 11 may be formed in the same conditions as the intrinsic amorphous layer 13, or may be formed in different conditions.

It is possible to form a film of p-type amorphous silicon doped with boron (B) as the p-type amorphous layer 12 by carrying out plasma CVD in conditions of a substrate temperature of 150 to 210° C., an $H_2$ gas flow rate of 0 to 100 sccm, an $SiH_4$ gas flow rate of 40 to 500 sccm, a $B_2H_6/H_2$ gas flow rate of 40 to 250 sccm, a pressure of 40 to 120 Pa, and a high-frequency power density of 5 to 15 mW/cm². It should be noted that $B_2H_6/H_2$ gas represents a gas in which $B_2H_6$ gas is diluted with $H_2$ gas.

It is possible to form the p layer 121 and the p⁻ layer 122 by changing the flow rates of the $B_2H_6/H_2$ gas. For example, the flow rate of the $B_2H_6/H_2$ gas is made 40 to 250 sccm in the p layer 121, and the flow rate of the $B_2H_6/H_2$ gas is made 10 to 100 sccm in the p⁻ layer 122.

Figure 2D:
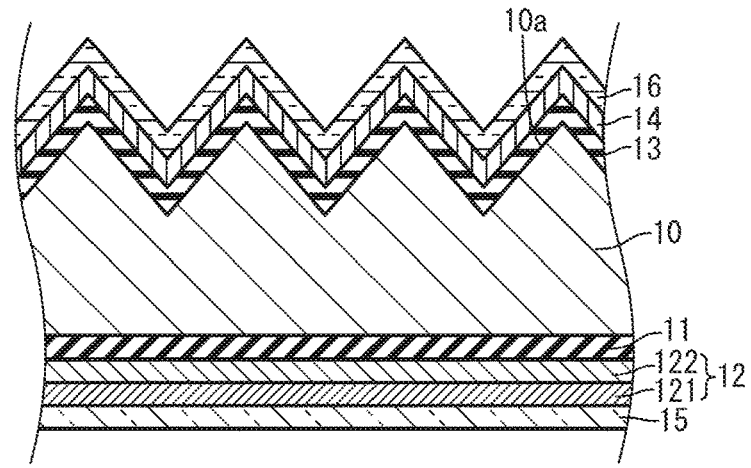
FIG. 2D is a drawing illustrating an example of the method of manufacturing the photoelectric conversion element.

The transparent conductive film 15 and the transparent conductive film 16 are formed on the p-type amorphous layer 12 and n-type amorphous layer 14, respectively (FIG. 2D). It is possible to form a film of ITO as the transparent conductive films 15 and 16 by sputtering, as follows. First, a sintered compact of $In_2O_2$ power into which 5 wt % of $SnO_2$ is mixed is established on the cathodes as a target. The substrate 10 is disposed to be parallel to the cathode, and the interior of the chamber is evacuated to a vacuum. The temperature of the substrate 10 is raised to be 180° C., a while a mixed gas of Ar gas (flow rate: 200 to 800 sccm) and 02 gas (flow rate: 0 to 30 sccm) flows, thereby holding the pressure in the chamber to 0.4 to 1.3 Pa, and a direct current power of 0.2 to 2 kW is introduced and discharged to the cathode.

Figure 2E:
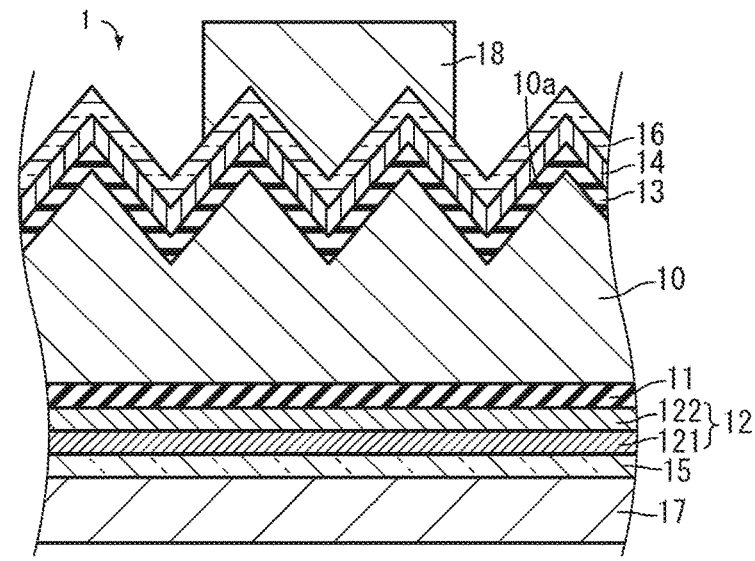
FIG. 2E is a drawing illustrating an example of the method of manufacturing the photoelectric conversion element.

The electrode 17 and electrode 18 are formed on the transparent conductive film 15 and transparent conductive film 16, respectively (FIG. 2E). It is possible to form the electrodes 17 and 18 by spreading an Ag paste in which a fine powder of silver (Ag) is kneaded into an epoxy resin by a screen printing method, then baking for 80 minutes as 200° C. In this way, the photoelectric conversion element 1 is completed.

[Effects of Photoelectric Conversion Element 1]

Figure 3:
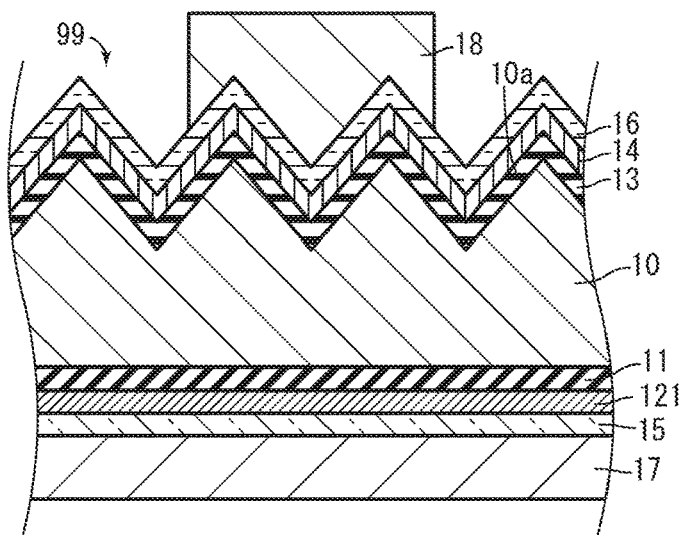
FIG. 3 is a cross-sectional view schematically illustrating a configuration of a photoelectric conversion element according to a comparative example.

The photoelectric conversion element 99 according to a comparative example will be described in order to describe the effects of the embodiment. FIG. 3 is a cross-sectional view schematically illustrating a configuration of a photoelectric conversion element 99. The photoelectric conversion element 99 is a configuration in which the p⁻ layer 122 is removed from the configuration of the photoelectric conversion element 1.

The photoelectric conversion element 99 is provided with a substantially intrinsic amorphous layer 11 that is formed between the substrate 10 and the p layer 121, similarly to the photoelectric conversion element 1. The intrinsic amorphous layer 11 lowers the interface level arising due to the junction of the substrate 10 and the p layer 121, and lowers the recombination of the light generated carrier.

However, there are cases where the dopant in the p layer 121 in the photoelectric conversion element 99 diffuses into the adjacent intrinsic amorphous layer 11 due to a heating process in the manufacturing process after the p layer 121 is formed. When the dopant diffused into the intrinsic amorphous layer 11, the recombination level in the pn junction increases, and the open circuit voltage Voc and the shape factor FF are lowered. Meanwhile, when a nitride film or oxide film is disposed between the intrinsic amorphous layer 11 and the p layer 121 in order to suppress diffusion of the dopant, the FF is lowered due to lowering of the short-circuit current Jsc. As a result, the conversion efficiency is lowered.

According to the embodiment, the photoelectric conversion element 1 is provided with a p⁻ layer 122 that is disposed between the intrinsic amorphous layer 11 and the p layer 121 and that has a lower dopant concentration than the p layer 121. The p⁻ layer 122 suppresses diffusion of the dopant from the p layer 121 into the intrinsic amorphous layer 11. The p⁻ layer 122 does not significantly increase the series resistance of the p-type amorphous layer 12. Therefore, according to the embodiment, it is possible for the Voc to be improved while maintaining the FF. As a result, it is possible for the conversion efficiency to be improved.

The capacity of the photoelectric conversion element 99 according to the comparative example deteriorates with the diffusion of the dopant in the p layer 121 when heat is received while used as a manufactured product. Meanwhile, in the case of the photoelectric conversion element 1, diffusion of the dopant from the p layer 121 to the intrinsic amorphous layer 11 is suppressed by the p⁻ layer 122 as described above. Therefore, the photoelectric conversion element 1 also has superior heat resistance.

Figure 4:
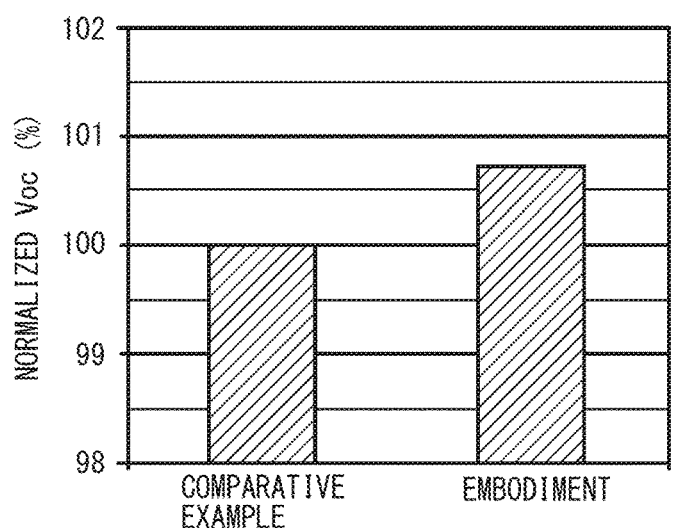
FIG. 4 is a drawing comparing a Voc of the photoelectric conversion element according to the comparative example and the Voc of the photoelectric conversion element according to the embodiment.
Figure 5:
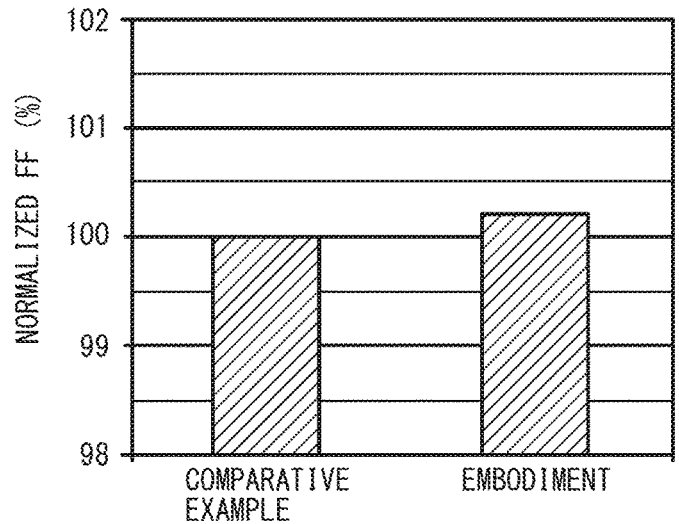
FIG. 5 is a drawing comparing an FF of the photoelectric conversion element according to the comparative example and the FF of the photoelectric conversion element according to the embodiment.

FIG. 4 is a drawing comparing the Voc of the photoelectric conversion element 99 according to the comparative example and the Voc of the photoelectric conversion element 1 according to the embodiment. FIG. 5 is a drawing comparing the FF of the photoelectric conversion element 99 and the FF of the photoelectric conversion element 1. As illustrated in FIGS. 4 and 5, according to the embodiment, it is possible for the Voc to be improved while maintaining the FF. The Jsc is substantially constant between the photoelectric conversion element 9 and the photoelectric conversion element 1.

Figure 6:
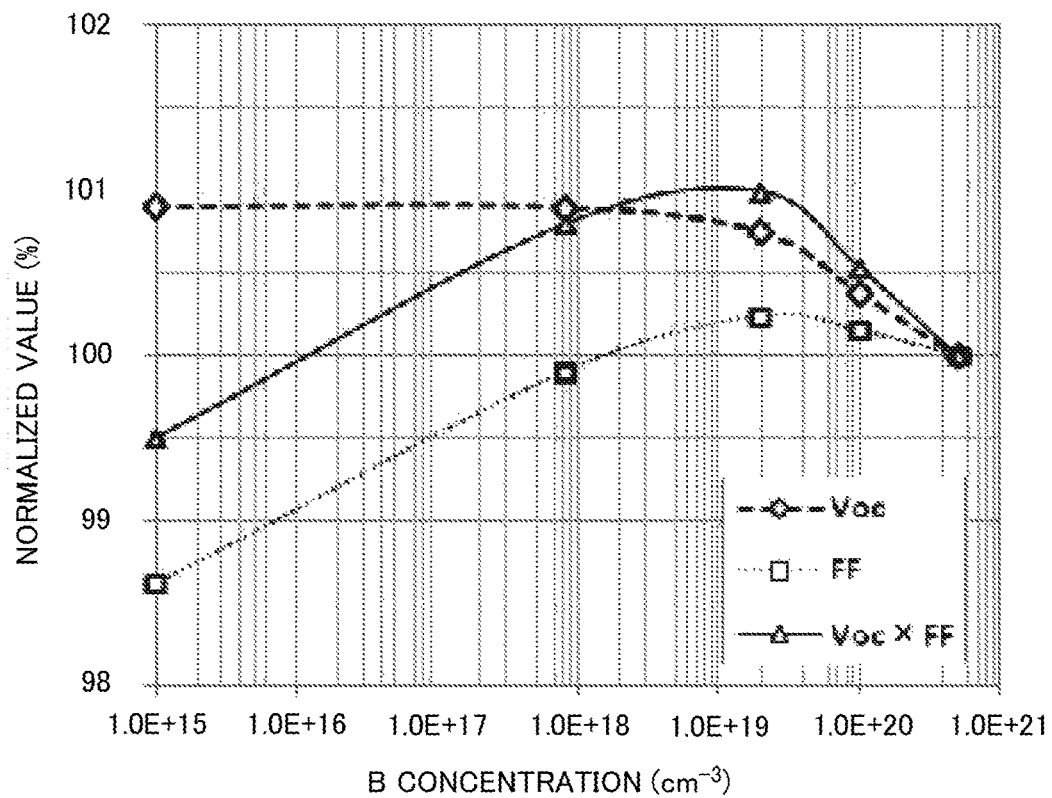
FIG. 6 is a graph illustrating changes in the Voc, FF and Voc×FF of the photoelectric conversion element when the dopant (boron) concentration of the p⁻ layer changes.

FIG. 6 is a graph illustrating changes in the Voc, FF and Voc×FF of the photoelectric conversion element 1 when the dopant (boron) concentration of the p⁻ layer 122 changes. The dopant concentration of the p layer 121 is $5 \times 10^{20}$ cm⁻³. The values on the vertical axis in FIG. 6 are relative values normalized with the value when the dopant concentration of the p⁻ layer 122 is made the same as the dopant concentration of the p layer 121.

As illustrated in FIG. 6, it is possible for the Voc×FF to be increased if the dopant concentration of the p⁻ layer 122 is $8 \times 10^{17}$ cm⁻³ or more and lower than the dopant concentration of the p layer 121. Because the Jsc is substantially constant even if the dopant concentration of the p⁻ layer 122 changes, if the Voc×FF increases, the conversion η=Jsc× Voc×FF also increases. That is, it is possible for the conversion efficiency to be increased if the dopant concentration of the p⁻ layer 122 is $8 \times 10^{17}$ cm$^{-3}$ or more and lower than the dopant concentration of the p layer 121.

The dopant concentration of the p⁻ layer 122 is preferably $1 \times 10^{20}$ cm$^{-3}$ or less. It is possible for the conversion efficiency to be remarkably increased if the dopant concentration of the p⁻ layer 122 is $1 \times 10^{20}$ cm$^{-3}$ or less. The dopant concentration of the p⁻ layer 122 is more preferably $2 \times 10^{19}$ cm$^{-3}$ or less.

Meanwhile, when the dopant concentration of the p⁻ layer 122 is less than $8 \times 10^{17}$ cm$^{-3}$, the FF decreases, and the conversion efficiency decreases. Accordingly, the dopant concentration of the p⁻ layer 122 is $8 \times 10^{17}$ cm$^{-3}$ or more.

Above, the first embodiment of the invention is described. In the embodiment, a case where the intrinsic amorphous layer 13 and the n-type amorphous layer 14 are formed on the surface 10a of the substrate 10 is described. However, the intrinsic amorphous layer 13 need not be included. An n⁺ layer in which a high concentration of n-type carrier is diffused into the substrate 10 may be formed instead of n-type amorphous layer 14.

In the embodiment, although a case where the surface of the side on which the n-type amorphous layer 14 is formed is the light receiving surface is described, the surface of the side on which the p-type amorphous layer 12 is formed may be the light receiving surface. In the embodiment, although a case where the substrate 10 is a single crystal silicon substrate is described, the substrate 10 may be a polycrystalline silicon substrate.

In the embodiment, although a case where the conductivity type of the substrate 10 is n-type is described, the conductivity type of the substrate 10 may be p-type. The amorphous layers (first concentration layer and second concentration layer) with different dopant concentrations may be formed on at least one of the p-type amorphous layer 12 and the n-type amorphous layer 14.

Modification Example 1 of First Embodiment

Figure 7:
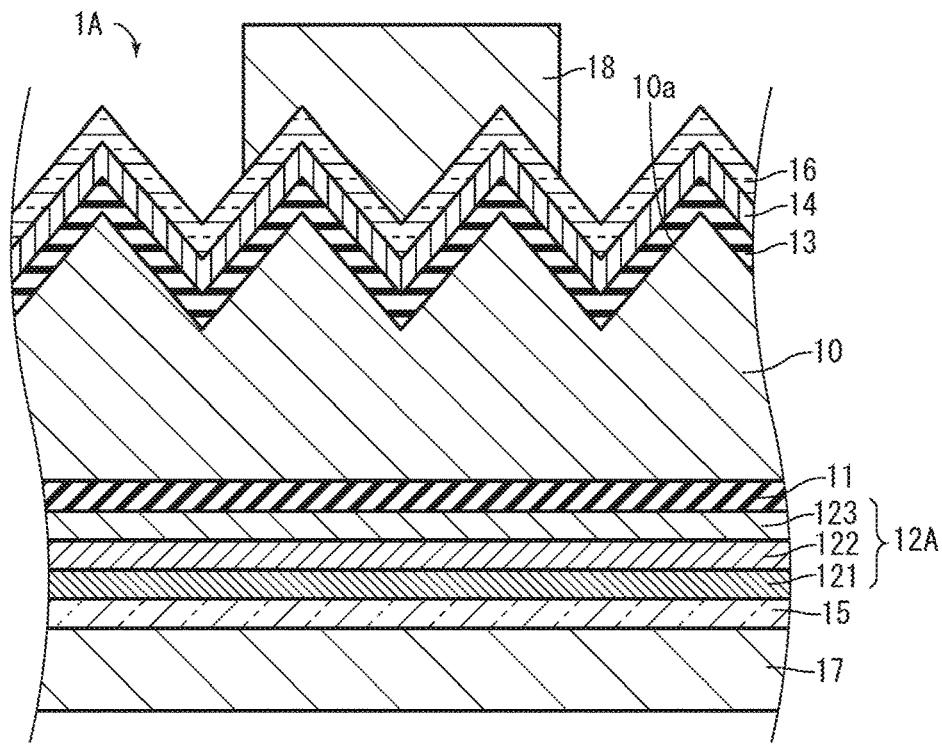
FIG. 7 is a cross-sectional view schematically illustrating a configuration of a photoelectric conversion element according to a modification example of the first embodiment.

FIG. 7 is a cross-sectional view schematically illustrating a configuration of a photoelectric conversion element 1A according to a modification example of the first embodiment. The photoelectric conversion element 1A is provided with a p-type amorphous layer 12A instead of the p-type amorphous layer 12 of the photoelectric conversion element 1.

The p-type amorphous layer 12A includes a p⁻ layer 123 (third concentration layer) instead of the p layer 121 and p⁻ layer 122. The p layer 121, p⁻ layer 122, and the p⁻ layer 123 are formed in the order of p⁻ layer 123, p⁻ layer 122, and p layer 121 from the substrate 10 side.

The p layer 121, the p⁻ layer 122, and the p⁻ layer 123 differ from one another in dopant concentration. That is, the p-type amorphous layer 12A is formed of three p-type amorphous layers with different dopant concentrations. The dopant concentration of the p⁻ layer 123 is $8 \times 10^{17}$ cm$^{-3}$ or more, similarly to the dopant concentration of the p⁻ layer 122, and is lower than the dopant concentration of the p layer 121. The level relationship between the dopant in the p⁻ layer 122 and the dopant concentration of the p⁻ layer 123 is arbitrary.

It is possible to manufacture the photoelectric conversion element 1A similarly to the photoelectric conversion element 1. It should be noted that it is possible to form the p⁻ layer 123 with the same method as the p⁻ layer 122.

Also according to the modification example, diffusion of the dopant from the p layer 121 into the intrinsic amorphous layer 11 is suppressed by the p⁻ layers 122 and 123. Therefore, the photoelectric conversion element 1A has superior conversion efficiency and heat resistance. It should be noted that although a case where the p-type amorphous layer 12A in the embodiment is formed of three p-type amorphous layers with different dopant concentrations is described, the p-type amorphous layer 12A may be formed from still more layers.

Modification Example 2 of First Embodiment

Figure 8:
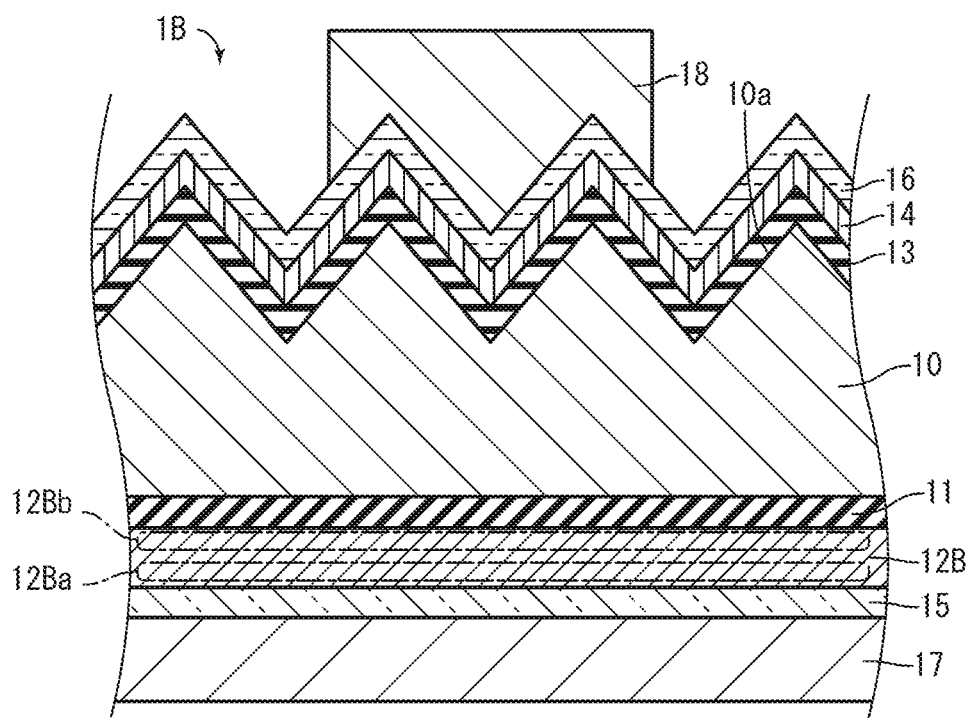
FIG. 8 is a cross-sectional view schematically illustrating a configuration of a photoelectric conversion element according to another modification example of the first embodiment.

FIG. 8 is a cross-sectional view schematically illustrating a configuration of the photoelectric conversion element 1B according to another modification example of the first embodiment. The photoelectric conversion element 1B is provided with a p-type amorphous layer 12B instead of the p-type amorphous layer 12 of the photoelectric conversion element 1.

The p-type amorphous layer 12B is a film of an amorphous semiconductor that has a p-type conductivity type and that contains hydrogen, similarly to the p-type amorphous layer 12. The dopant concentration of the p-type amorphous layer 12B continuously changes from the transparent conductive film 15 side towards the intrinsic amorphous layer 11 side. The dopant concentration of the p-type amorphous layer 12B is highest at the portion 12Ba adjacent to the transparent conductive film 15, and is lower than the dopant concentration at the part 12Bb adjacent to the intrinsic amorphous layer 11. The dopant concentration at the part 12Bb adjacent to the intrinsic amorphous layer 11 is $8 \times 10^{17}$ cm$^{-3}$ or more and is lower than the dopant concentration at the part 12Ba adjacent to the transparent conductive film 15.

It is possible to manufacture the photoelectric conversion element 1B similarly to the photoelectric conversion element 1. It should be noted that it is possible for the p-type amorphous layer 12B to be formed by forming a film by plasma CVD while the flow rate of the $B_2H_6/H_2$ gas is continuously changed.

Also according to the modification example, diffusion of the dopant from the portion 12Ba adjacent to the transparent conductive film 15 into the intrinsic amorphous layer 11 is suppressed by the part 12Bb adjacent to the intrinsic amorphous layer 11. Therefore, the photoelectric conversion element 1B has superior conversion efficiency and heat resistance.

Second Embodiment

Figure 9:
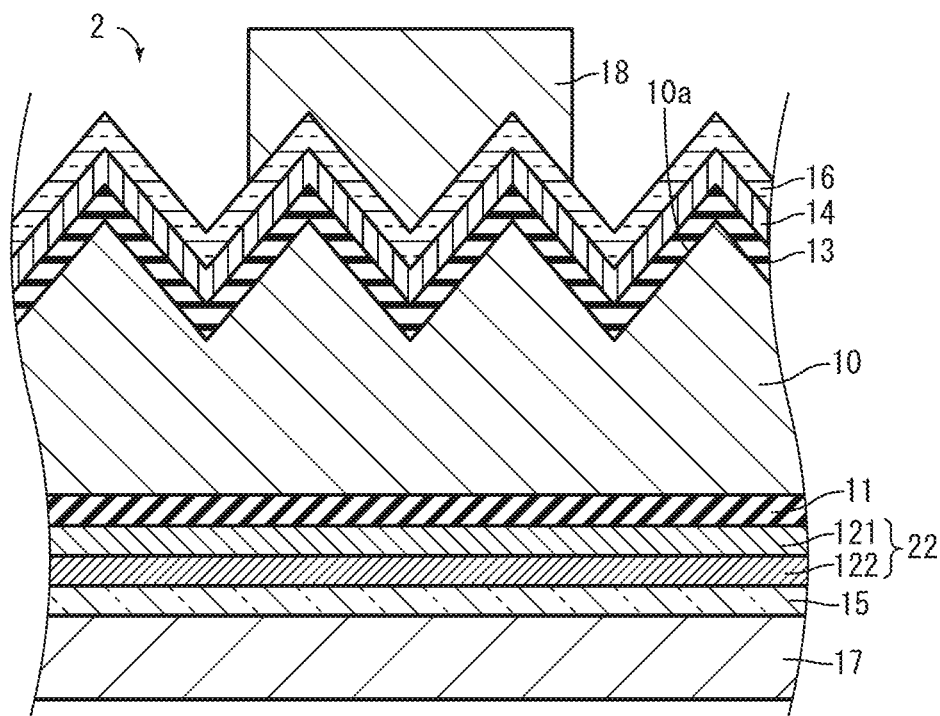
FIG. 9 is a cross-sectional view schematically illustrating a configuration of a photoelectric conversion element according to a second embodiment of the invention.

FIG. 9 is a cross-sectional view schematically illustrating a configuration of the photoelectric conversion element 2 according to the second embodiment of the invention. The photoelectric conversion element 2 is provided with a p-type amorphous layer 22 instead of the p-type amorphous layer 12 of the photoelectric conversion element 1.

The p-type amorphous layer 22 has a different stacking order of the p layer 121 and the p⁻ layer 122 compared to the p-type amorphous layer 12. In the embodiment, the p layer 121 and the p⁻ layer 122 are formed in the order of p layer 121 and p⁻ layer 122 from the substrate 10 side. That is, the p layer 121 is formed on the intrinsic amorphous layer 11, and the p⁻ layer 122 is formed on the p layer 121.

It is possible to manufacture the photoelectric conversion element 2 similarly to the photoelectric conversion element 1.

According to the embodiment, diffusion of the dopant from the p layer 121 into the transparent conductive film 15 is suppressed by the p⁻ layer 122. Accordingly, an increase in the recombination level in the transparent conductive film 15. Therefore, the photoelectric conversion element 2 has superior conversion efficiency and heat resistance.

Third Embodiment

Figure 10:
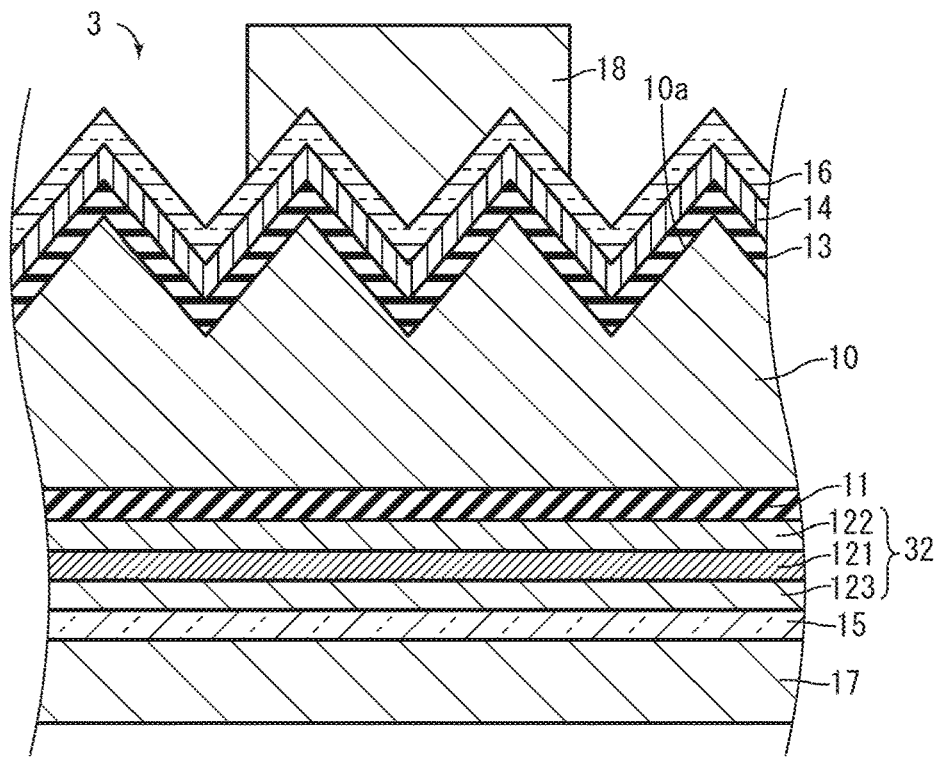
FIG. 10 is a cross-sectional view schematically illustrating a configuration of a photoelectric conversion element according to a third embodiment of the invention.

FIG. 10 is a cross-sectional view schematically illustrating a configuration of the photoelectric conversion element 3 according to a third embodiment of the invention. The photoelectric conversion element 3 is provided with a p-type amorphous layer 32 instead of the p-type amorphous layer 12 of the photoelectric conversion element 1.

The p-type amorphous layer 32 includes the p layer 121, the p⁻ layer 122, and the p⁻ layer 123, similarly to the p-type amorphous layer 12A of the photoelectric conversion element 1A (FIG. 7). The p-type amorphous layer 32 has a different stacking order of the p layer 121, the p⁻ layer 122, and the p⁻ layer 123, compared to the p-type amorphous layer 12A. In the embodiment, the p layer 121, the p⁻ layer 122, and the p⁻ layer 123 are formed in the order of p⁻ layer 122, p layer 121, and p⁻ layer 123 from the substrate 10 side. That is, the p⁻ layer 122 is formed on the intrinsic amorphous layer 11, the p layer 121 is formed on the p⁻ layer 122, and the p⁻ layer 123 is formed on the p layer 121.

It is possible to manufacture the photoelectric conversion element 3 similarly to the photoelectric conversion element 1.

According to the embodiment, the diffusion of the dopant from the p layer 121 into the intrinsic amorphous layer 11 is suppressed by the p⁻ layer 122, and the diffusion of the dopant from the p layer 121 into the transparent conductive film 15 is suppressed by the p⁻ layer 123. Therefore, the photoelectric conversion element 3 has superior conversion efficiency and heat resistance.

Modification Example of Third Embodiment

Figure 11:
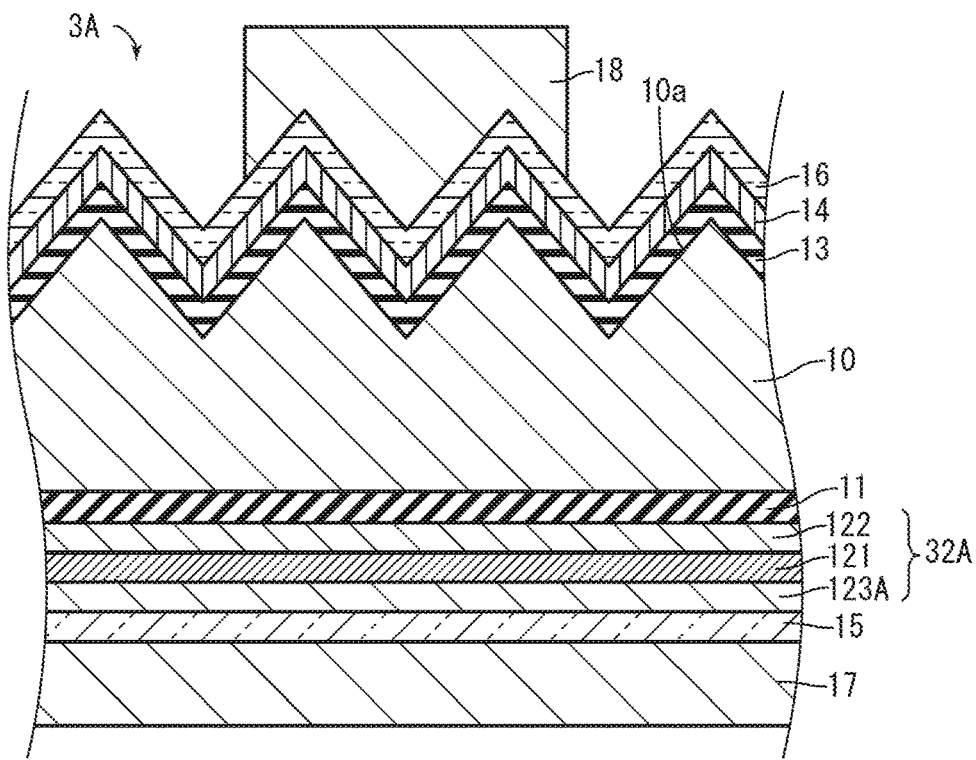
FIG. 11 is a cross-sectional view schematically illustrating a configuration of a photoelectric conversion element according to a modification example of the third embodiment of the invention.

FIG. 11 is a cross-sectional view schematically illustrating a configuration of a photoelectric conversion element 3A according to a modification example of the third embodiment. The photoelectric conversion element 3A is provided with a p-type amorphous layer 32A instead of the p-type amorphous layer 32 of the photoelectric conversion element 3.

The p-type amorphous layer 32A is provided with the p⁻ layer 123A instead of the p⁻ layer 123 of the p-type amorphous layer 32. The p⁻ layer 123A is a microcrystalline layer. It is possible to lower the contact resistance between the p-type amorphous layer 32A and the transparent conductive film 15 by the p⁻ layer 123A being a microcrystalline layer. Thereby, it is possible for the conversion to be further improved.

It should be noted that the p⁻ layer 122 may also be a microcrystalline layer, in addition to the p⁻ layer 123A. The p⁻ layer 122 may have a configuration that becomes gradually more microcrystalline from an amorphous state from the intrinsic amorphous layer 11 towards the p layer 121.

It is possible to manufacture the photoelectric conversion element 3A similarly to the photoelectric conversion element 1. It should be noted that it is possible for the microcrystalline layer to be formed by increasing the dilution ratio of the $SiH_4$ gas by means of the $H_2$ gas during the plasma CVD.

Fourth Embodiment

Figure 12:
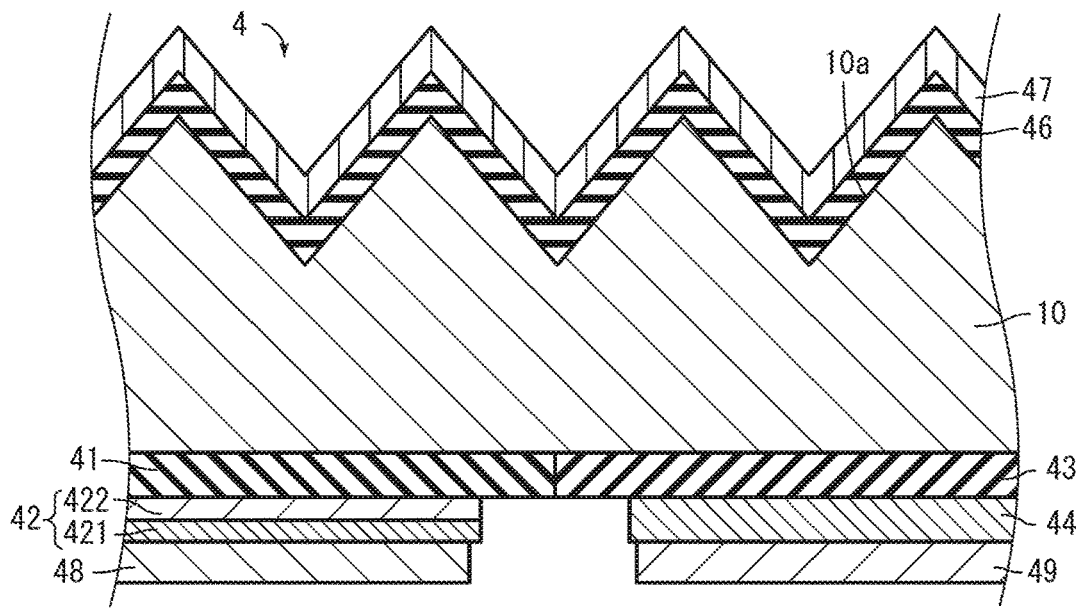
FIG. 12 is a cross-sectional view schematically illustrating a configuration of a photoelectric conversion element according to a fourth embodiment of the invention.

FIG. 12 is a cross-sectional view schematically illustrating a configuration of the photoelectric conversion element 4 according to a fourth embodiment of the invention. The photoelectric conversion element 4 is provided with a substrate 10, intrinsic amorphous layers 41, 43, and 46, a p-type amorphous layer 42 (first conductive amorphous layer), an n-type amorphous layer 44 (second conductive amorphous layer), a light receiving surface n-type amorphous layer 47, and electrodes 48 (conductive film) and 49.

In the embodiment, the p-type amorphous layer 42 and the n-type amorphous layer 44 are formed on one of the substrate 10. The p-type amorphous layer 42 and the n-type amorphous layer 44 are disposed adjacent to one another in the in-plane direction of the substrate 10. The p-type amorphous layer 42 and the n-type amorphous layer 44 is formed on the surface on the side opposite to the surface 10a on which the texture 10a is formed. That is, the photoelectric conversion element 4 is a so-called back surface bonding-type photoelectric conversion element.

Also in the embodiment, the intrinsic amorphous layers are disposed between the substrate 10 and the p-type amorphous layer 42 and between the substrate 10 and the n-type amorphous layer 44. More specifically, the intrinsic amorphous layer 41 is disposed between the substrate 10 and the p-type amorphous layer 42 and the intrinsic amorphous layer 43 is disposed between the substrate 10 and the n-type amorphous layer 44.

The intrinsic amorphous layer 46 and the n-type amorphous layer 47 are formed on the surface 10a of the substrate 10. The light receiving surface n-type amorphous layer 47 is a so-called front surface field (FSF) layer.

The intrinsic amorphous layers 41, 43, and 46 are films of an amorphous semiconductor layer that are substantially intrinsic and contain hydrogen, similarly to the intrinsic amorphous layers 11 and 13.

The n-type amorphous layer 44 and the light receiving surface n-type amorphous layer 47 are films of an amorphous semiconductor that have an n-type conductivity type and that contain hydrogen, similarly to the n-type amorphous layer 14.

The p-type amorphous layer 42 is a film of an amorphous semiconductor that has a p-type conductivity type and that contains hydrogen, similarly to the p-type amorphous layer 12. The p-type amorphous layer 42 includes a p layer 421 (first concentration layer) and a p⁻ layer 422 (second concentration layer) that are stacked. In the embodiment, the p layer 421 and the p⁻ layer 422 are formed in the order of the p⁻ layer 422 and p layer 421 from the substrate 10 side. That is, the p⁻ layer 422 is formed on the intrinsic amorphous layer 41, and the p layer 421 is formed on the p⁻ layer 422.

The electrode 48 is formed on the p-type amorphous layer 42. The electrode 49 is formed on the n-type amorphous layer 44. The electrodes 48 and 49 are resin compositions into which a conductive filler such as silver powder is kneaded. The electrodes 48 and 49 may be transparent conductive films and may be indium tin oxide (ITO), ZnO, indium tungsten oxide (IWO) or the like. The electrodes 48 and 49 may be metal films, and may be silver (Ag), aluminum (Al), nickel (Ni), copper (Cu), tin (Sn), platinum (Pt), gold (Au), chrome (Cr), tungsten (W), cobalt (Co), titanium (Ti), alloys thereof, or a stacked film of two or more of these metals. The electrodes 48 and 49 may be a stacked film of the light-transmissive conductive film and the metal film.

[Method of Manufacturing Photoelectric Conversion Element 4]

An example of the method of manufacturing the photoelectric conversion element 4 will be described with reference to FIGS. 13A to 13G.

Figure 13A:
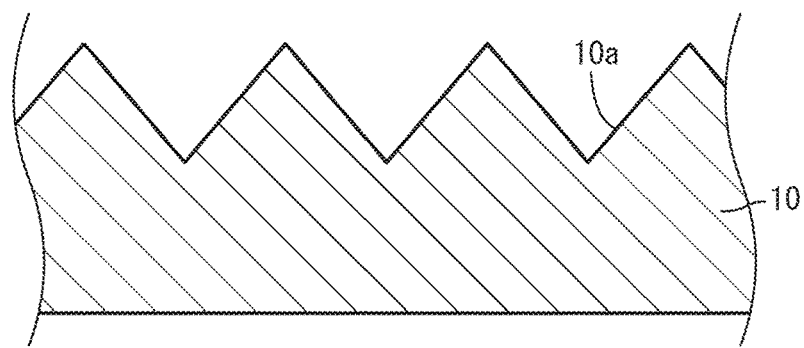
FIG. 13A is a drawing illustrating an example of a method of manufacturing the photoelectric conversion element.

A texture is formed on the surface 10a of the substrate 10 (FIG. 13A). It is possible to form the texture by anisotropic etching using an alkali solution.

Figure 13B:
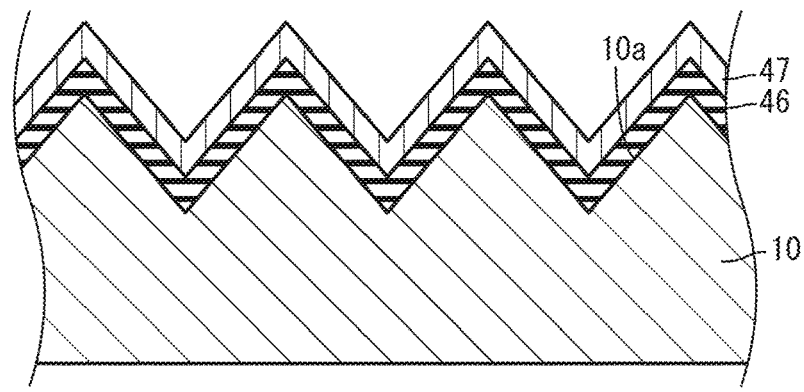
FIG. 13B is a drawing illustrating an example of the method of manufacturing the photoelectric conversion element.

The intrinsic amorphous layer 46 and the light receiving surface n-type amorphous layer 47 are formed on the surface 10a of the substrate 10 (FIG. 13B). It is possible to form the intrinsic amorphous layer 46 and light receiving surface n-type amorphous layer 47 by plasma CVD.

Figure 13C:
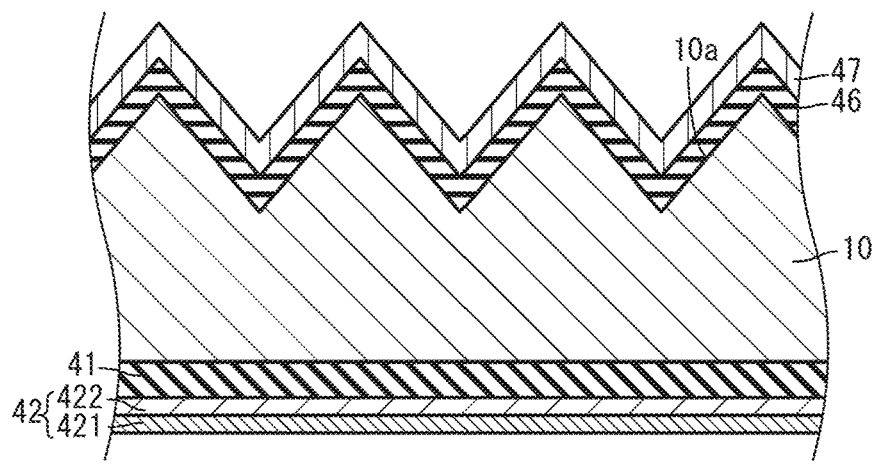
FIG. 13C is a drawing illustrating an example of the method of manufacturing the photoelectric conversion element.

The intrinsic amorphous layer 41 and the p-type amorphous layer 42 are formed on the surface on the opposite side to the surface 10a (FIG. 13C). It is possible to form the intrinsic amorphous layer 41 and p-type amorphous layer 42 by plasma CVD.

Figure 13D:
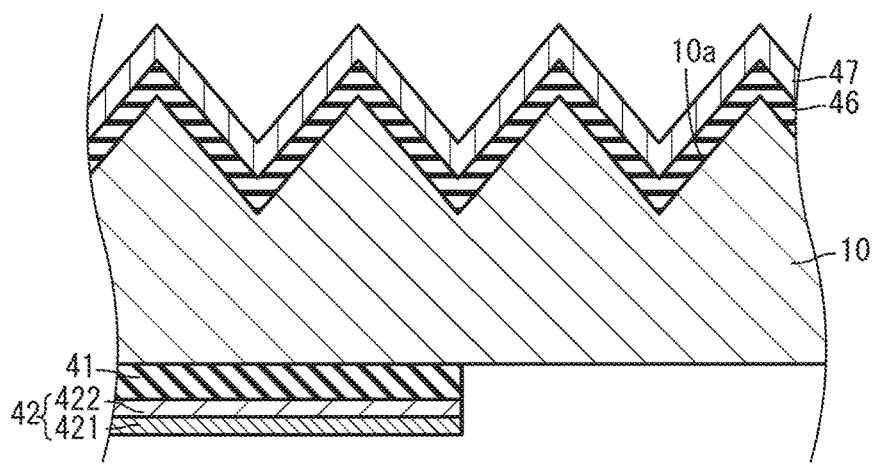
FIG. 13D is a drawing illustrating an example of the method of manufacturing the photoelectric conversion element.

The intrinsic amorphous layer 41 and p-type amorphous layer 42 are patterned (FIG. 13D). It is possible for the patterning to be performed by forming a mask by photolithography, and removing the portions other than the masked portion by etching.

Figure 13E:
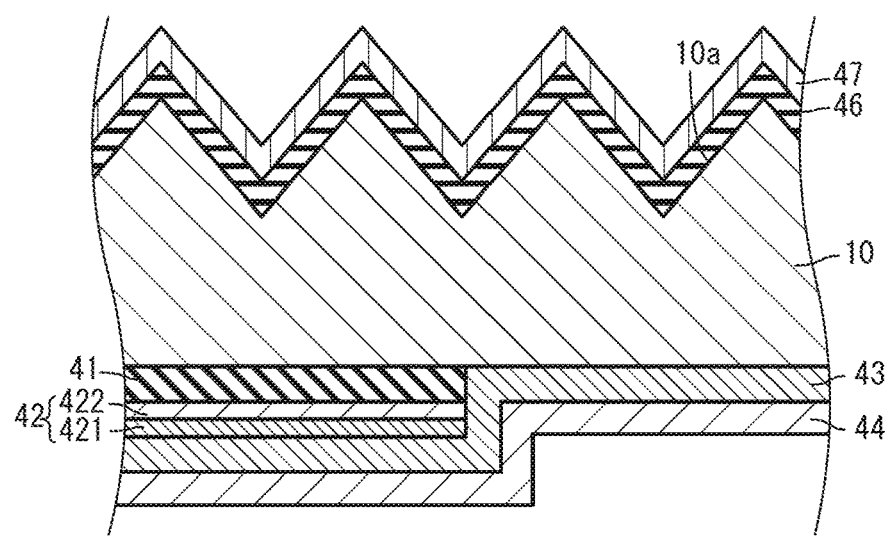
FIG. 13E is a drawing illustrating an example of the method of manufacturing the photoelectric conversion element.

The intrinsic amorphous layer 43 and the n-type amorphous layer 44 are formed covering a portion of the substrate 10, the intrinsic amorphous layer 41, and the p-type amorphous layer 42 (FIG. 13E). It is possible to form the intrinsic amorphous layer 43 and n-type amorphous layer 44 by plasma CVD.

Figure 13F:
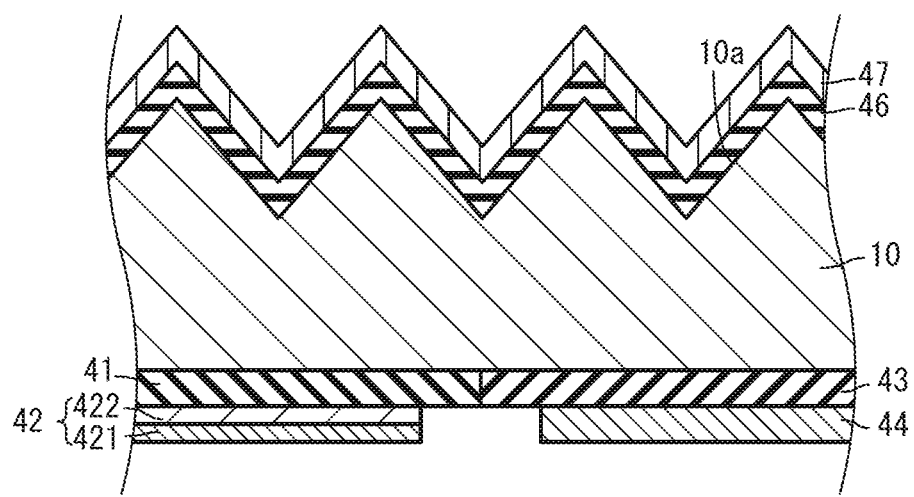
FIG. 13F is a drawing illustrating an example of the method of manufacturing the photoelectric conversion element.

The intrinsic amorphous layer 43 and n-type amorphous layer 44 are patterned (FIG. 13F). It is possible for the patterning to be performed by forming a mask by photolithography, and removing the portions other than the masked portion by etching.

Figure 13G:
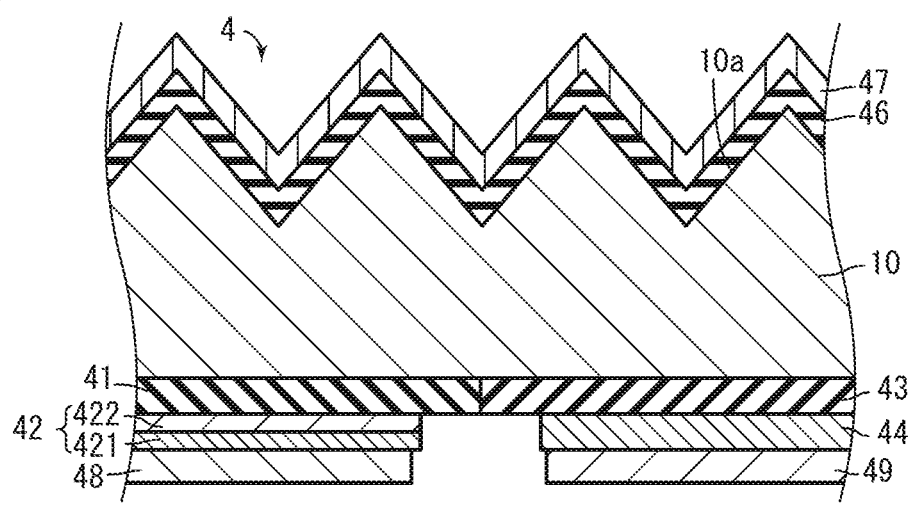
FIG. 13G is a drawing illustrating an example of the method of manufacturing the photoelectric conversion element.

The electrode 48 is formed on the p-type amorphous layer 42 and the electrode 49 is formed on the n-type amorphous layer 44 (FIG. 13G). It is possible to form the electrodes 48 and 49 by spreading an Ag paste in which a fine powder of silver (Ag) is kneaded into an epoxy resin by a screen printing method, then baking for 80 minutes as 200° C. In this way, the photoelectric conversion element 4 is completed.

[Effects of Photoelectric Conversion Element 4]

According to the embodiment, diffusion of the dopant from the p layer 421 into the intrinsic amorphous layer 41 is suppressed by the p⁻ layer 422. Therefore, the photoelectric conversion element 4 has superior conversion efficiency and heat resistance.

According to the embodiment, it is possible for the Voc and FF to be improved by using the p⁻ layer 422, and, as a result, the capacity as a solar battery can be improved.

It should be noted that in the embodiment, the intrinsic amorphous layers 43 and 46 need not be present. An n⁺ layer in which a high concentration of n-type carrier is diffused into the substrate 10 may be formed instead of light receiving surface n-type amorphous layer 47. The substrate 10 may be a polycrystalline silicon substrate, and the conductivity type may be p-type.

In the embodiment, although a case where a texture 10a is formed on one surface of the substrate 10 is described, the texture may be formed on both surfaces of the substrate 10.

Also in the back surface bonding-type photoelectric conversion element such as exemplified by the fourth embodiment, it is possible to apply a configuration of various p-type amorphous layers exemplified in the first to third embodiments and in the modification examples thereof.

Modification Example of Fourth Embodiment

Figure 14:
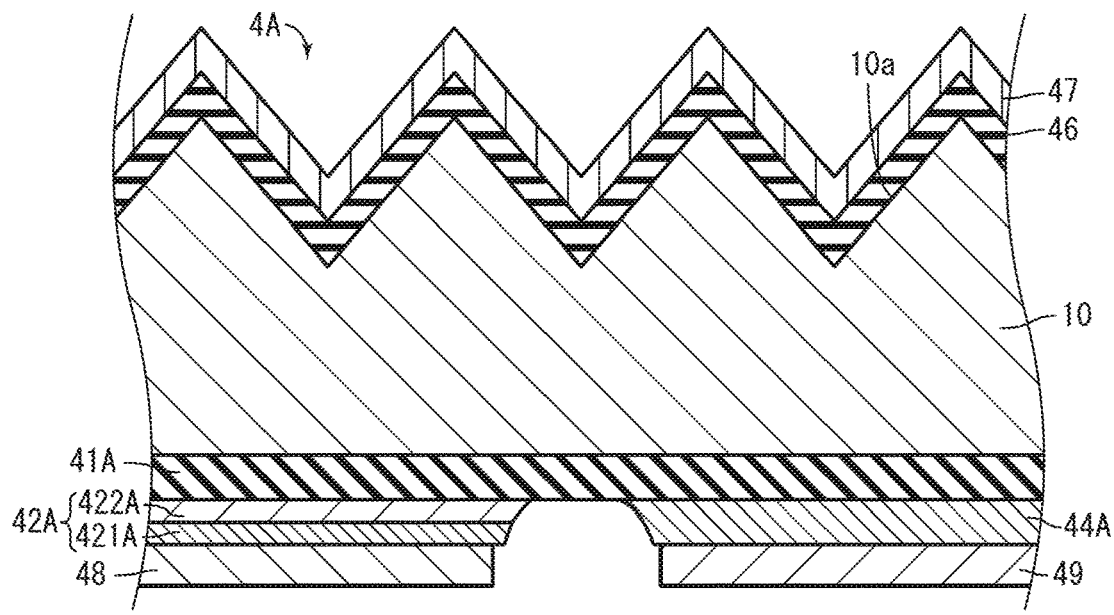
FIG. 14 is a cross-sectional view schematically illustrating a configuration of a photoelectric conversion element according to a modification example of the fourth embodiment of the invention.

FIG. 14 is a cross-sectional view schematically illustrating a configuration of a photoelectric conversion element 4A according to a modification example of the fourth embodiment. The photoelectric conversion element 4A is provided with an intrinsic amorphous layer 41A formed on substantially the entirety of one surface of the substrate 10, instead of the intrinsic amorphous layers 41 and 43 of the photoelectric conversion element 4. The photoelectric conversion element 4A is further provided with a p-type amorphous layer 42A and an n-type amorphous layer 44A instead of the p-type amorphous layer 42 and n-type amorphous layer 44, respectively.

The p-type amorphous layer 42A includes a stacked p layer 421A and the p⁻ layer 422A, similarly to the p-type amorphous layer 42.

The texture may also be formed on both surfaces of the substrate 10 in the photoelectric conversion element 4A.

[Method of Manufacturing Photoelectric Conversion Element 4A]

An example of the method of manufacturing the photoelectric conversion element 4A will be described with reference to FIGS. 15A to 15F.

Figure 15A:
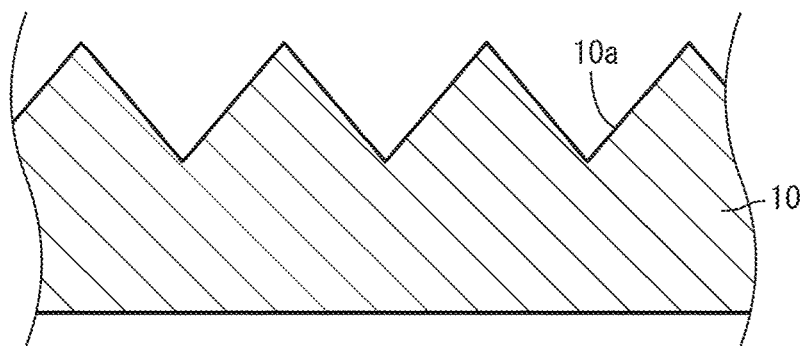
FIG. 15A is a drawing illustrating an example of a method of manufacturing the photoelectric conversion element.

A texture is formed on the surface 10a of the substrate 10 (FIG. 15A). It is possible to form the texture by anisotropic etching using an alkali solution.

Figure 15B:
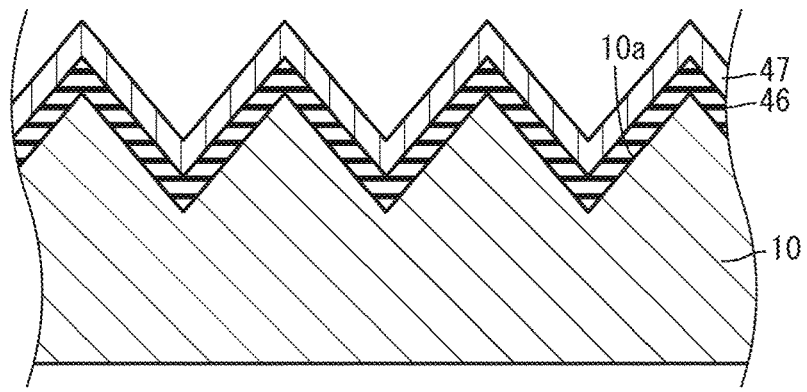
FIG. 15B is a drawing illustrating an example of the method of manufacturing the photoelectric conversion element.

The intrinsic amorphous layer 46 and the light receiving surface n-type amorphous layer 47 are formed on the surface 10a of the substrate 10 (FIG. 15B). It is possible to form the intrinsic amorphous layer 46 and light receiving surface n-type amorphous layer 47 by plasma CVD.

Figure 15C:
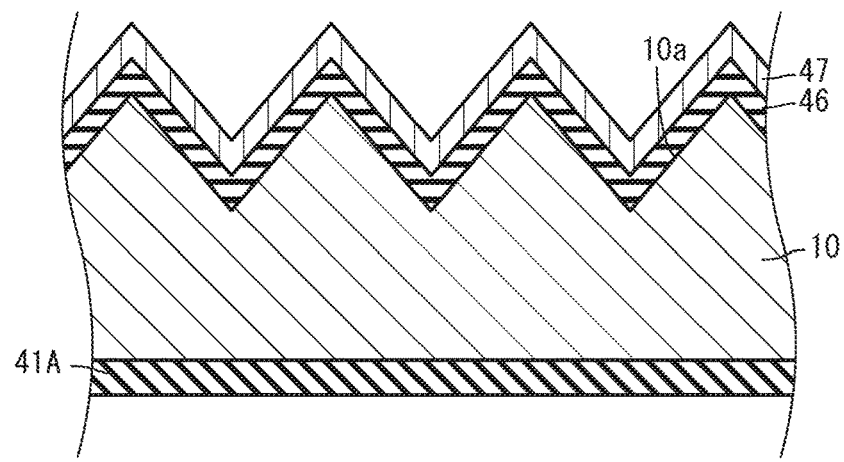
FIG. 15C is a drawing illustrating an example of the method of manufacturing the photoelectric conversion element.

The intrinsic amorphous layer 41A is formed on the surface on the side opposite to the surface 10a (FIG. 15C). It is possible for the intrinsic amorphous layer 41 to be formed by plasma CVD.

Figure 15D:
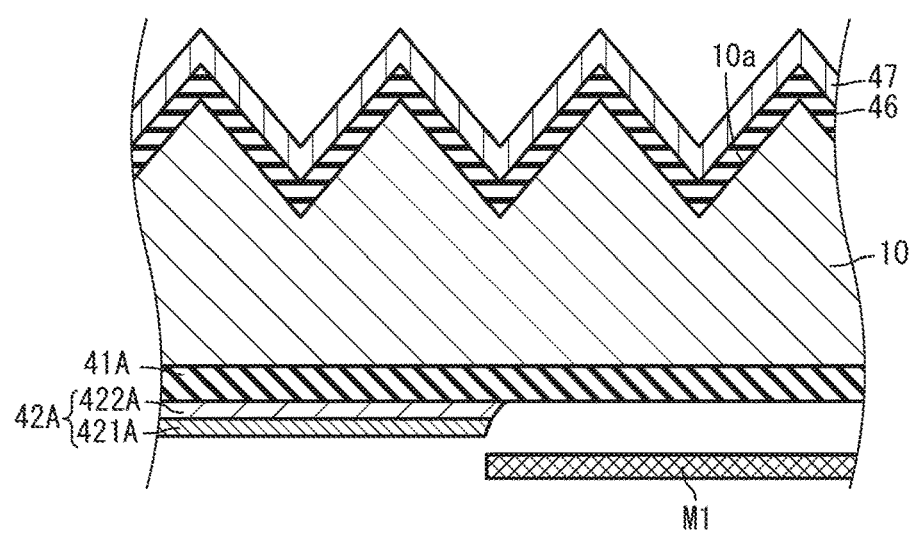
FIG. 15D is a drawing illustrating an example of the method of manufacturing the photoelectric conversion element.

Next, the p-type amorphous layer 42A is patterned and formed by a shadow masking process using a mask M1 (FIG. 15D). It is possible for the p-type amorphous layer 42A to be formed by plasma CVD.

The material of the mask M1 is not particularly limited, and is tungsten steel, copper, nickel, nickel alloy (alloy 42, invar material), molybdenum, or the like. The mask M1 need not be a metal, and may be a glass, ceramic, organic film or the like. A substrate of the same material of the substrate 10 may be worked by etching and made into the mask M1. In this case, because the substrate 10 and the mask M1 are formed of the same material, the coefficients of thermal expansion are the same, and a positional shift due to a different in the coefficients of thermal expansion does not arise.

In a case where the substrate 10 is a silicon substrate, it is preferable that the material of the mask M1 be alloy 42, when the coefficient of thermal expansion and the raw material costs are taken into consideration. When focusing on the coefficient of thermal expansion, in a case where the material of the mask M1 has a nickel constitution of approximately 36% and an iron constitution of approximately 64%, it is possible for the difference in the coefficient of thermal expansion with the substrate 10 to be maximally reduced, and possible for the positional shift due to the difference in coefficients of thermal expansion to be maximally reduced.

It is preferable that the mask M1 be reproduced and usable a plurality of times from the viewpoint of suppressing the production running costs. In this case, it is possible for the film formation material attached to the mask M1 to be removed using hydrofluoric acid or NaOH. Taking the number of reproductions into account, it is preferable that the thickness of the mask M1 be 30 to 300 μm.

Next, the n-type amorphous layer 44A is patterned and formed by a shadow masking process using a mask M2

Figure 15E:
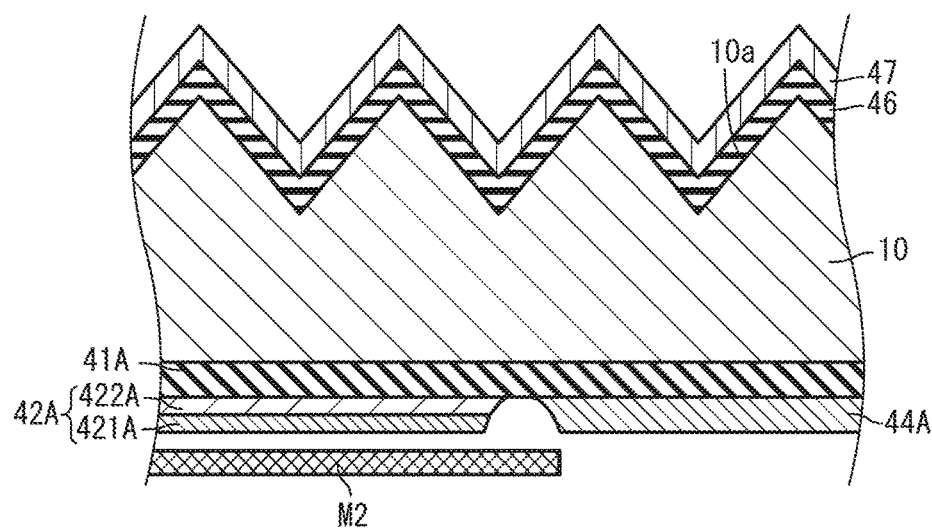
FIG. 15E is a drawing illustrating an example of the method of manufacturing the photoelectric conversion element.

(FIG. 15E). It is possible for the n-type amorphous layer 44A to be formed by plasma CVD.

Figure 15F:
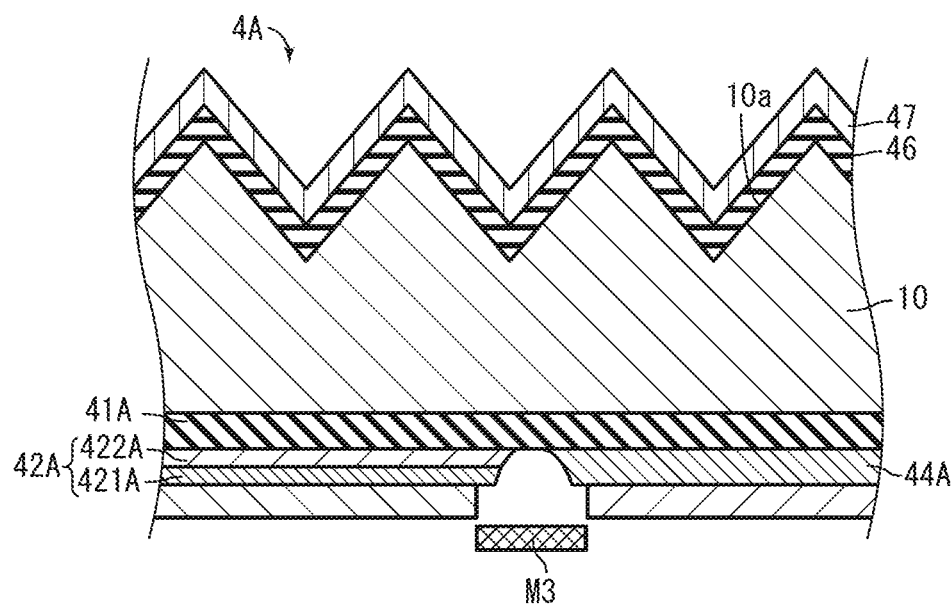
FIG. 15F is a drawing illustrating an example of the method of manufacturing the photoelectric conversion element.

The electrode 48 is formed on the p-type amorphous layer 42 and the electrode 49 is formed on the n-type amorphous layer 44. It is possible to form the electrodes 48 and 49 by spreading an Ag paste in which a fine powder of silver (Ag) is kneaded into an epoxy resin by a screen printing method, then baking for 80 minutes as 200° C. It is possible to form the electrodes 48 and 49 using sputtering or an EB deposition method in a case where the electrodes 48 and 49 are a light-transmissive conductive film or a metal film. In this case, it is possible to pattern and form the electrodes 48 and 49 by a shadow masking process using a mask M3, as illustrated in FIG. 15F.

[Effects of Photoelectric Conversion Element 4A]

Also according to the modification example, diffusion of the dopant from the p layer 421A into the intrinsic amorphous layer 41 is suppressed by the p⁻ layer 422A. Therefore, the photoelectric conversion element 4A has superior conversion efficiency and heat resistance.

It is possible to not perform the etching step by patterning using a mask, as illustrated in the modification example. Therefore, it is possible to manufacture the photoelectric conversion element 4A at low cost, compared to the photoelectric conversion element 4.

Figure 16:
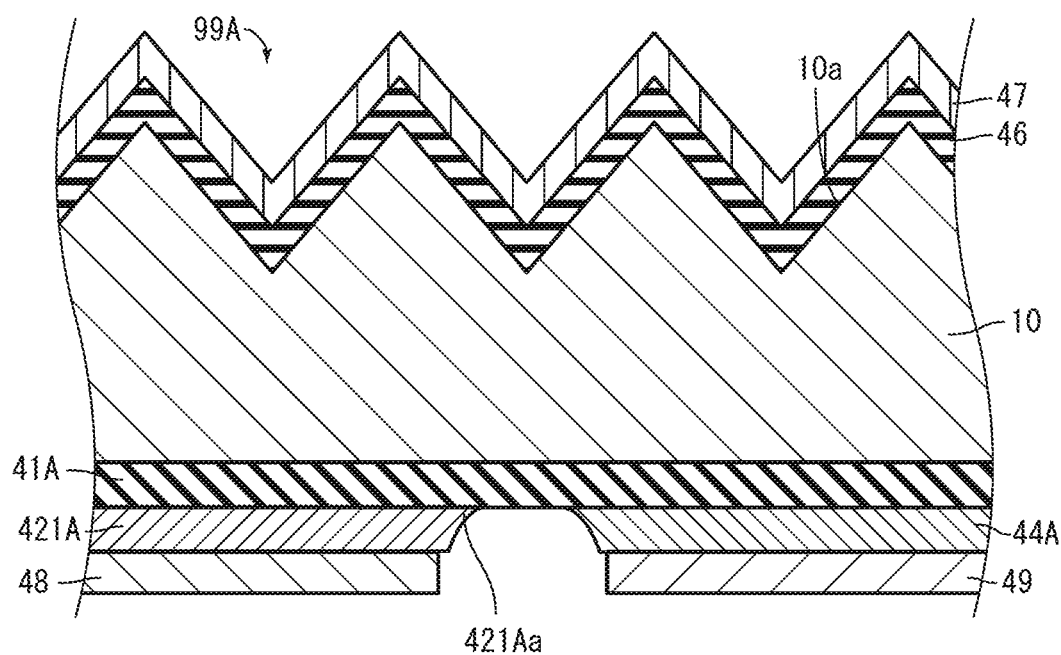
FIG. 16 is a cross-sectional view schematically illustrating a configuration of a photoelectric conversion element according to a comparative example.

The photoelectric conversion element 99A according to a comparative example will be described in order to describe the effects of the modification example. FIG. 16 is a cross-sectional view schematically illustrating a configuration of a photoelectric conversion element 99A. The photoelectric conversion element 99A is a configuration in which the p⁻ layer 422A is removed from the configuration of the photoelectric conversion element 4A.

The photoelectric conversion element 99A is manufactured by a shadow masking process using a mask, similarly to the photoelectric conversion element 4A. When the p layer 421A is formed by a shadow masking process, the raw material gas sneaks to the rear side of the mask. Accordingly, there are cases where the high boron concentration region 421Aa is formed on the region (below, referred to as a gap region) between the p layer 421A and the n-type amorphous layer 44A.

Figure 17:
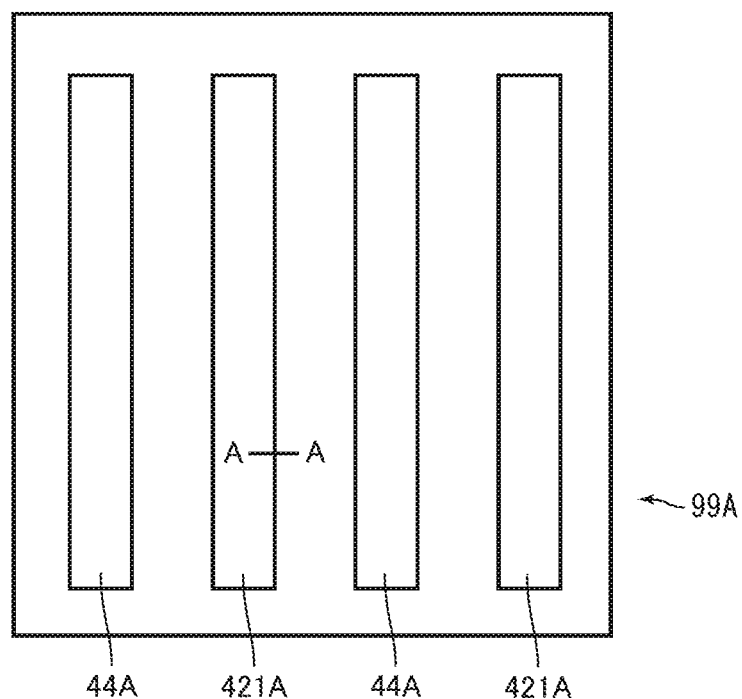
FIG. 17 is a plan view in which the photoelectric conversion element is viewed from the surface of the side opposite a light receiving surface.
Figure 18:
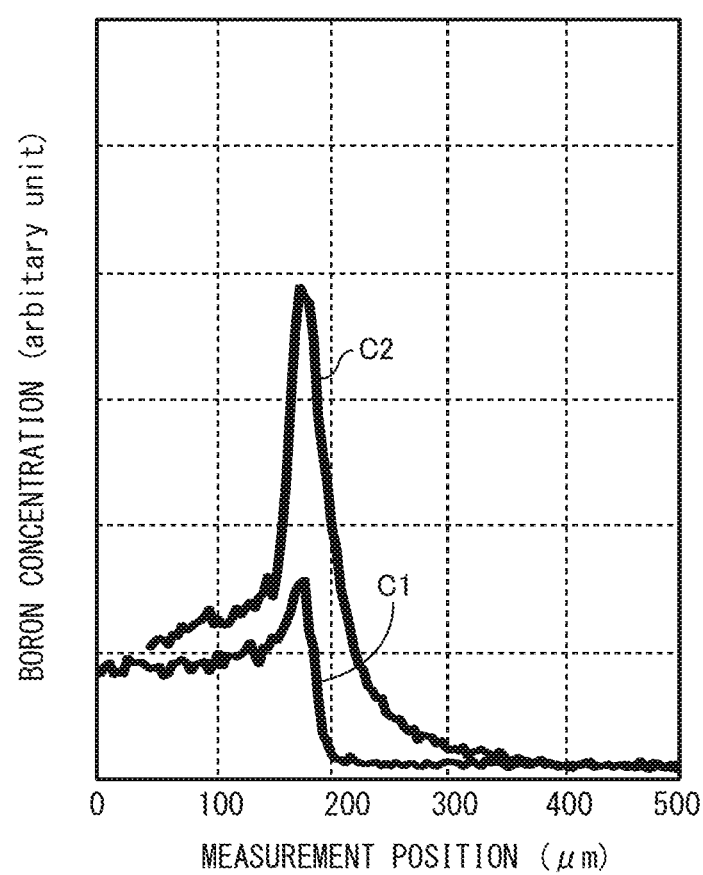
FIG. 18 is a profile of boron concentration measured along the line A-A in FIG. 17.

FIG. 17 is a plan view in which the photoelectric conversion element 99A is viewed from the surface (below, referred to as the rear surface of the substrate 10) of the side opposite the light receiving surface. FIG. 18 is a profile of boron concentration measured along the line A-A in FIG. 17. FIG. 17 is obtained measured with a time-of-flight secondary ion mass spectrometry method (TOF-SIMS). The curve C1 is a profile of a case where the rear surface of the substrate 10 is a mirror surface, and the curve C2 is a profile of a case where a texture with a height of 1.5 μm is formed on the rear surface of the substrate 10.

As illustrated in FIG. 18, when the p layer 421A is patterned by a shadow masking process, a high boron concentration region is formed in the vicinity of the gap region. When such a high boron concentration region is formed in the gap region, diffusion of the boron occurs in the gap region, and the FF which is a characteristic of solar batteries is reduced.

According to the configuration of the photoelectric conversion element 4A, the p⁻ layer is formed between the intrinsic amorphous layer 41A and the p layer 421A. Accordingly, it is possible for diffusion of the boron in the gap region to be suppressed.

As illustrated in FIG. 18, a case where the texture is formed has a higher boron concentration in the high concentration region than a case where the rear surface of the substrate 10 is a mirror surface. Therefore, the modification example has a suitably large diffusion prevention effect in a case where the texture is formed on both surfaces of the substrate 10.

Fifth Embodiment

Figure 19:
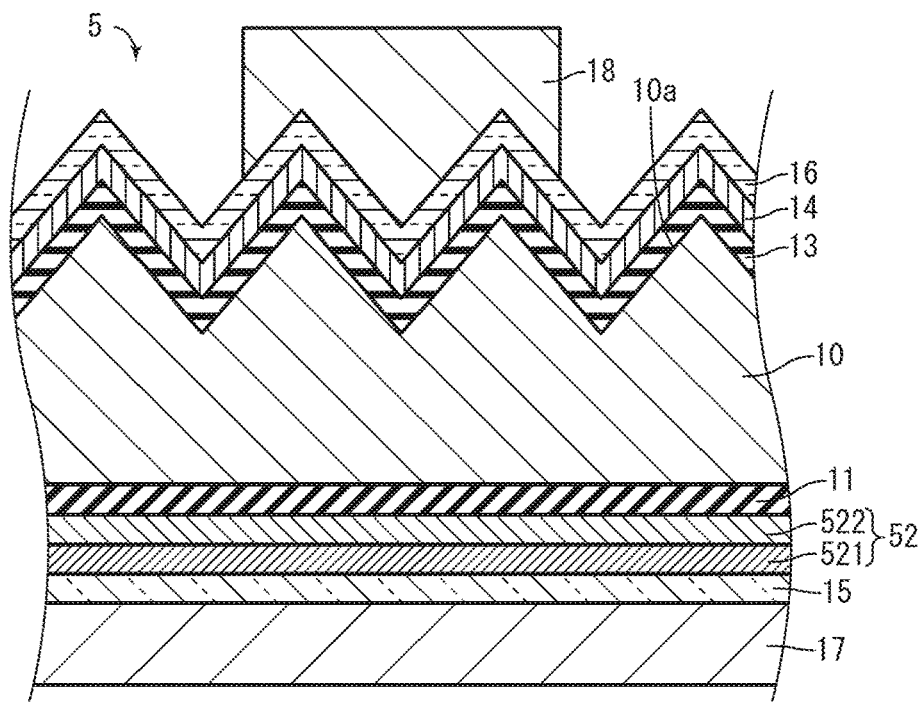
FIG. 19 is a cross-sectional view schematically illustrating a configuration of a photoelectric conversion element according to a fifth embodiment of the invention.

FIG. 19 is a cross-sectional view schematically illustrating a configuration of the photoelectric conversion element 5 according to the fifth embodiment of the invention. The photoelectric conversion element 5 is provided with a p-type amorphous layer 52 instead of the p-type amorphous layer 12 of the photoelectric conversion element 1.

The p-type amorphous layer 52 is a film of an amorphous semiconductor that has a p-type conductivity type and that contains hydrogen. The p-type amorphous layer 52 includes a p layer 521 (first concentration layer) and a P-containing p layer 522 (second concentration layer) that are stacked. In the embodiment, the p layer 521 and the P-containing p layer 522 are formed in the order of P-containing p layer 522 and p layer 521 from the substrate 10 side. That is, the P-containing p layer 522 is formed to contact the intrinsic amorphous layer 11.

The p layer 521 contains boron (B) as the dopant. The dopant concentration of the p layer 521 is $1 \times 10^{19}$ to $1 \times 10^{21}$ cm$^{-3}$.

The P-containing p layer 522 contains both boron and phosphorous as dopants. The boron concentration of the P-containing p layer 522 is, for example, $1 \times 10^{19}$ to $1 \times 10^{21}$ cm$^{-3}$. The phosphorous concentration of the P-containing p layer 522 is $2 \times 10^{16}$ to $1 \times 10^{20}$ cm$^{-3}$. It should be noted that although the P-containing p layer 522 contains phosphorous, the conductivity type is p-type. That is, the P-containing p layer 522 has a higher boron concentration than phosphorous concentration.

The p layer 521 and the P-containing p layer 522 are formed of a p-type amorphous silicon, a p-type amorphous silicon germanium, a p-type amorphous germanium, a p-type amorphous silicon carbide, a p-type amorphous silicon nitride, a p-type amorphous silicon oxide, a p-type amorphous silicon carbon oxide, and the like. The thicknesses of the p layer 121 and the P-containing p layer 122 are each 2 to 50 nm.

It is possible to manufacture the photoelectric conversion element 5 similarly to the photoelectric conversion element 1.

It is possible to form a film of p-type amorphous silicon doped with boron (B) as the p layer 521 by carrying out plasma CVD in conditions of a substrate temperature of 150 to 210° C., an H$_2$ gas flow rate of 0 to 100 sccm, an SiH$_4$ gas flow rate of 40 to 500 sccm, a B$_2$H$_6$/H$_2$ gas flow rate of 40 to 250 sccm, a pressure of 40 to 120 Pa, and a high-frequency power density of 5 to 15 mW/cm². It should be noted that B$_2$H$_6$/H$_2$ gas represents a gas in which B$_2$H$_6$ gas is diluted with H$_2$ gas.

It is possible to form a film of amorphous silicon doped with both boron and phosphorous as the P-containing p layer 522 by carrying out plasma CVD in conditions of a substrate temperature of 150 to 210° C., an H$_2$ gas flow rate of 0 to 100 sccm, an SiH$_4$ gas flow rate of 40 to 500 sccm, a B$_2$H$_6$/H$_2$ gas flow rate of 40 to 250 sccm, a PH$_3$/H$_2$ gas flow rate of 100 to 500 sccm, a pressure of 40 to 120 Pa, and a high-frequency power density of 5 to 15 mW/cm². That is, it is possible to form the P-containing p layer 522 by carrying out plasma CVD while introducing both B$_2$H$_6$/H$_2$ gas and PH$_3$/H$_2$ gas.

[Effects of Photoelectric Conversion Element 5]

The effects of the embodiment will be described compared to the photoelectric conversion element 99 illustrated in FIG. 3.

The photoelectric conversion element 99 is provided with a substantially intrinsic amorphous layer 11 that is formed between the substrate 10 and the p layer 121, similarly to the photoelectric conversion element 5. The intrinsic amorphous layer 11 lowers the interface level arising due to the junction of the substrate 10 and the p layer 121, and lowers the recombination of the light generated carrier.

However, there are cases where the dopant in the p layer 121 in the photoelectric conversion element 99 diffuses into the adjacent intrinsic amorphous layer 11 due to a heating process in the manufacturing process after the p layer 121 is formed. When the dopant diffused into the intrinsic amorphous layer 11, the recombination level in the pn junction increases, and the open circuit voltage Voc and the shape factor FF are lowered. Meanwhile, when a nitride film or oxide film is disposed between the intrinsic amorphous layer 11 and the p layer 121 in order to suppress diffusion of the dopant, the FF is lowered due to lowering of the short-circuit current Jsc. As a result, the conversion efficiency is lowered.

According to the embodiment, the photoelectric conversion element 5 is provided with a P-containing p layer 522 that is disposed between the intrinsic amorphous layer 11 and the p layer 521 and that includes phosphorous. The P-containing p layer 522 suppresses diffusion of the dopant from the p layer 521 into the intrinsic amorphous layer 11. The P-containing p layer 522 does not increase the series resistance of the p-type amorphous layer 52. According to the embodiment, it is possible for the FF to be improved while maintaining the Voc. As a result, it is possible for the conversion efficiency to be improved.

The capacity of the photoelectric conversion element 99 according to the comparative example deteriorates with the diffusion of the dopant in the p layer 121 when heat is received while used as a manufactured product. Meanwhile, in the case of the photoelectric conversion element 5, diffusion of the dopant from the p layer 521 to the intrinsic amorphous layer 11 is suppressed by the P-containing p layer 522 as described above. Therefore, the photoelectric conversion element 5 also has superior heat resistance.

Figure 20:
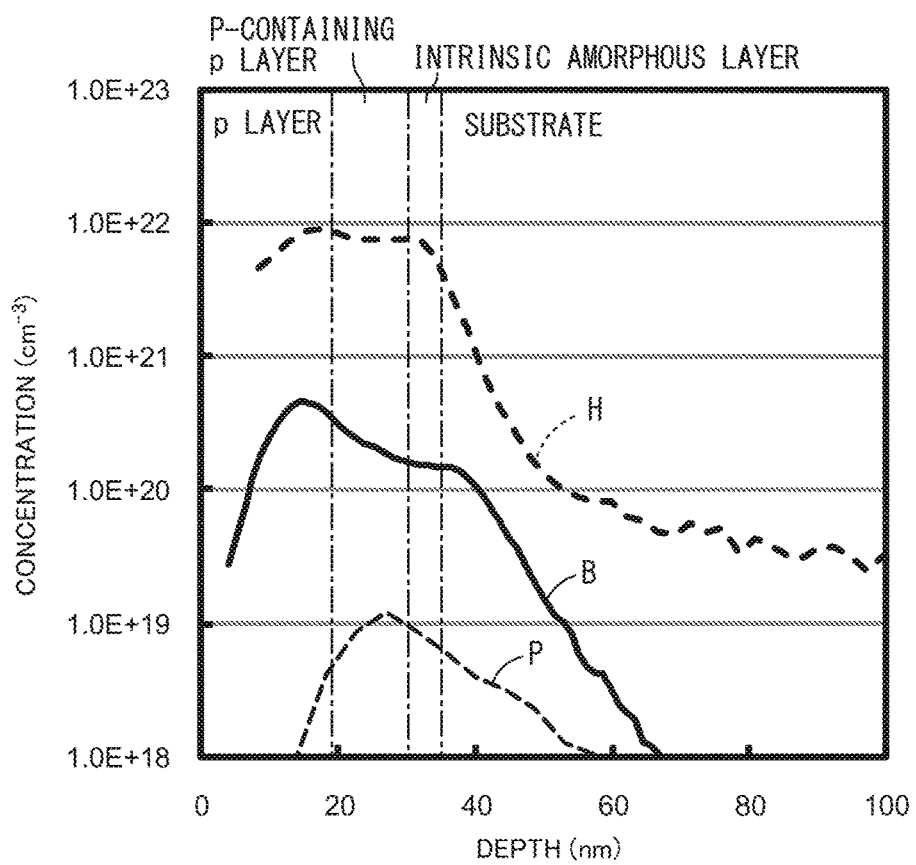
FIG. 20 is an impurity profile of a pn junction of the photoelectric conversion element according to an embodiment.
Figure 21:
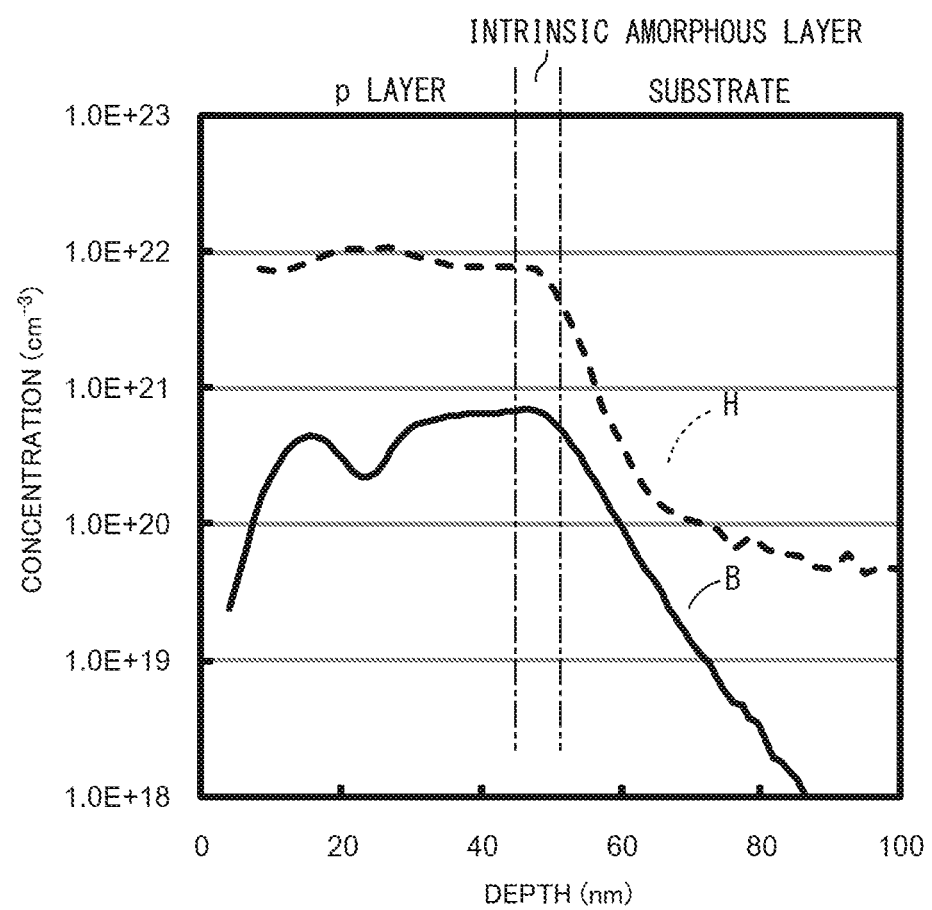
FIG. 21 is an impurity profile of a pn junction of the photoelectric conversion element according to a comparative example.

FIG. 20 is an impurity profile of a pn junction of the photoelectric conversion element 5. FIG. 21 is an impurity profile of a pn junction of the photoelectric conversion element 99. It is understood from FIGS. 20 and 21 that it is possible to suppress the diffusion of boron into the intrinsic amorphous layer 11 in the photoelectric conversion element 5 compared to the photoelectric conversion element 99.

Figure 22:
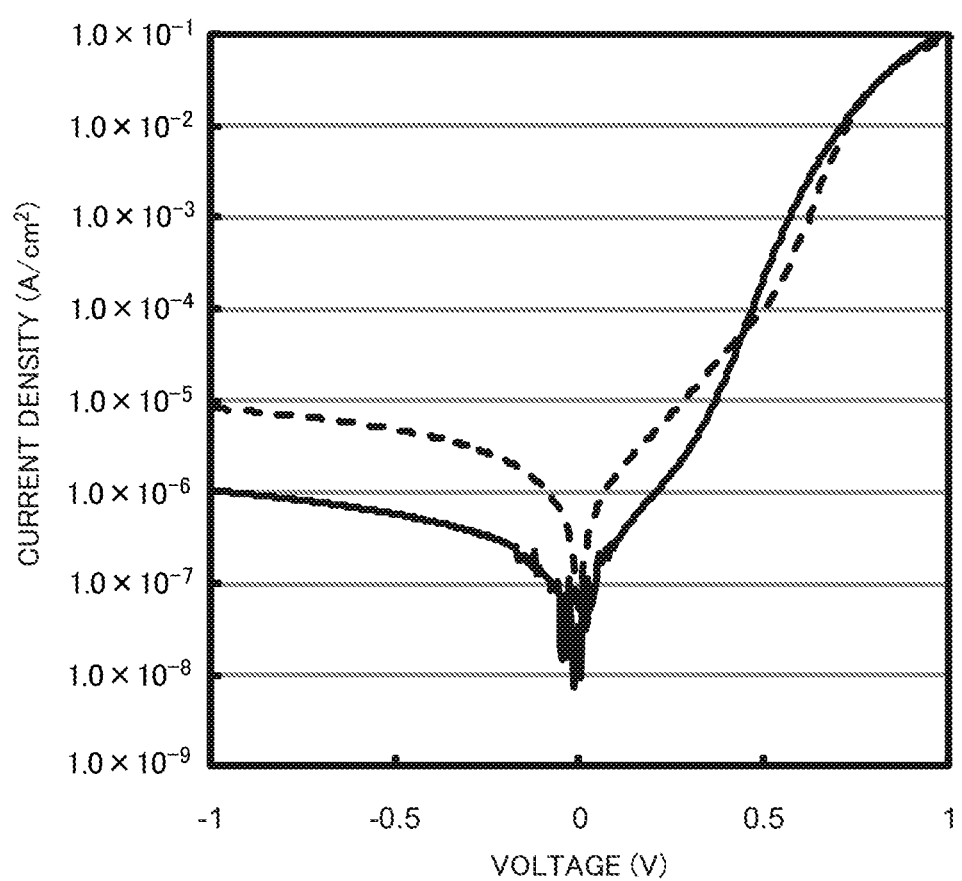
FIG. 22 is an IV curve of the photoelectric conversion element according to the embodiment and the photoelectric conversion element according to the comparative example when not being irradiated with solar light.

FIG. 22 is IV curves of the photoelectric conversion element 5 and photoelectric conversion element 99 when not being irradiated with solar light. In FIG. 22, the solid line is the IV curve of the photoelectric conversion element 5, and the dotted line is the IV curve of the photoelectric conversion element 99. As illustrated in FIG. 22, it is possible to reduce the reverse saturation current in the photoelectric conversion element 5 compared to the photoelectric conversion element 99. This is thought to be because the diffusion of boron due to the P-containing p layer 522 in the photoelectric conversion element 5 is suppressed, in contrast to boron diffusing from the p layer 121 into the intrinsic amorphous layer 11 in the photoelectric conversion element 99, thereby increasing the recombination level.

Figure 23:
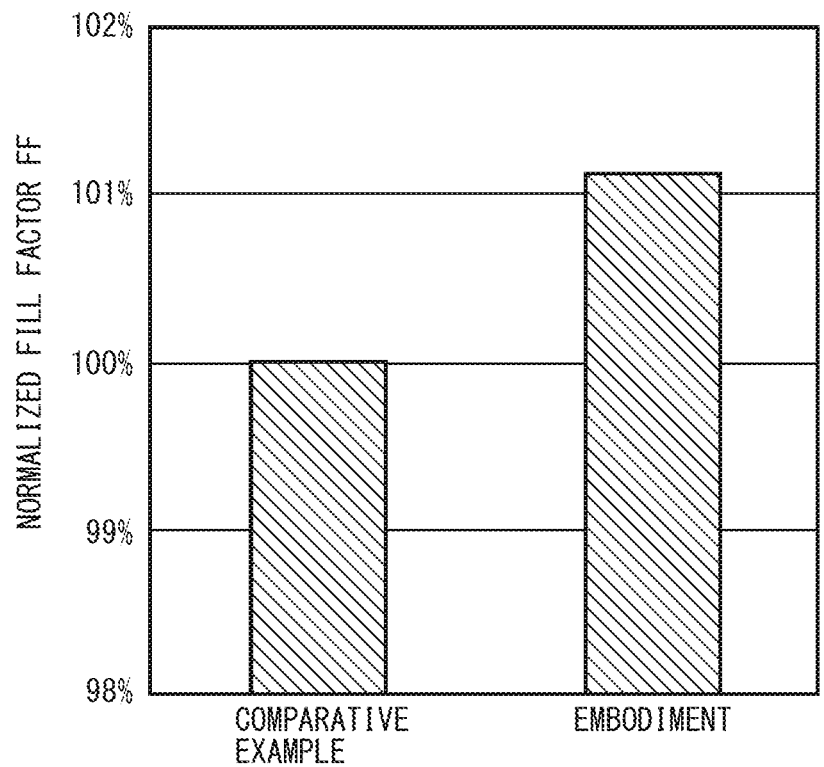
FIG. 23 is a drawing comparing the FF of the photoelectric conversion element according to the comparative example and the FF of the photoelectric conversion element according to the embodiment.
Figure 24:
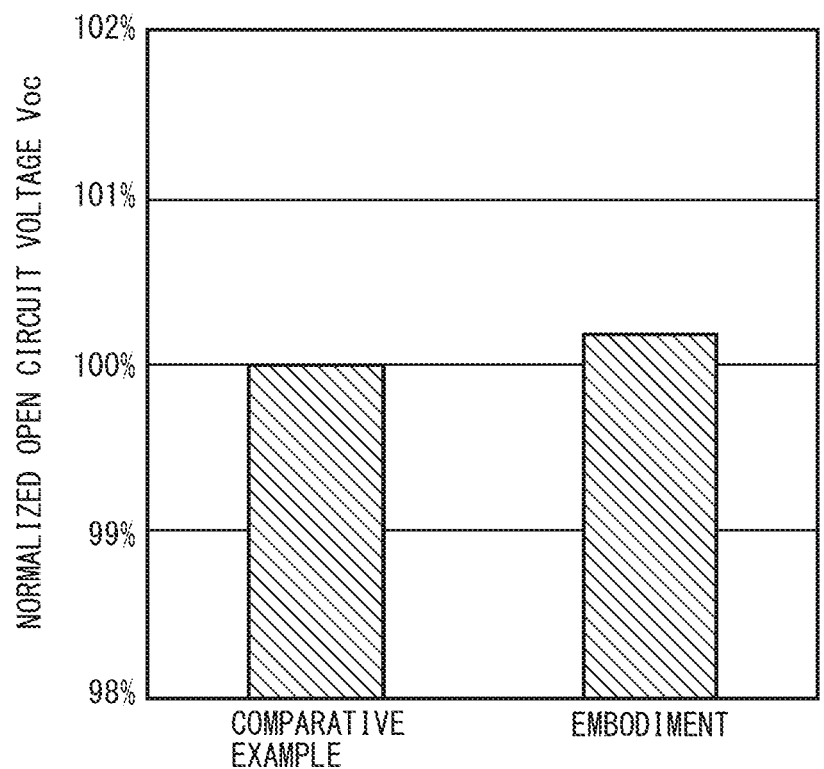
FIG. 24 is a drawing comparing the Voc of the photoelectric conversion element according to the comparative example and the Voc of the photoelectric conversion element according to the embodiment.

FIG. 23 is a drawing comparing the FF of the photoelectric conversion element 99 and the FF of the photoelectric conversion element 5. FIG. 24 is a drawing comparing the Voc of the photoelectric conversion element 99 and the Voc of the photoelectric conversion element 5. As illustrated in FIGS. 23 and 24, according to the embodiment, it is possible for the FF to be improved while maintaining the Voc.

Figure 25:
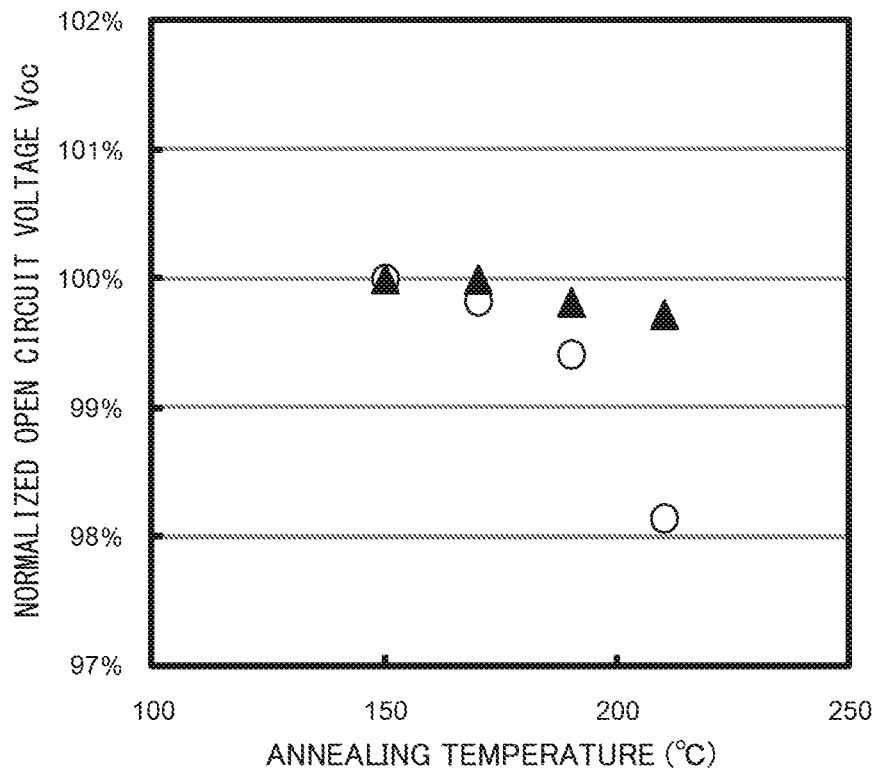
FIG. 25 is a drawing comparing the post-annealing Voc of the photoelectric conversion element according to the comparative example and the post-annealing Voc of the photoelectric conversion element according to the embodiment.
Figure 26:
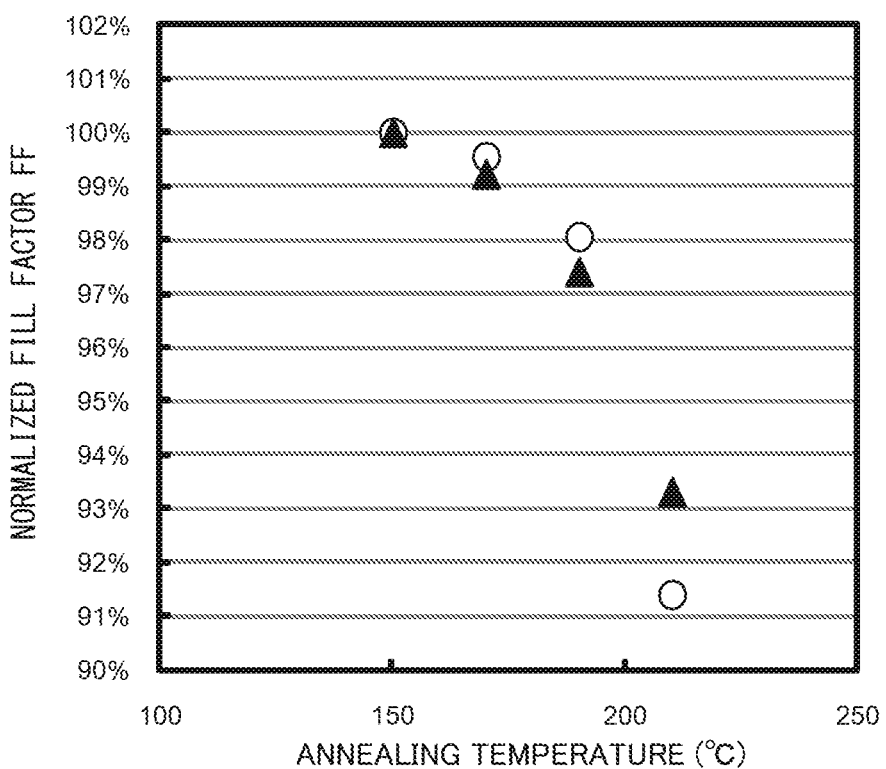
FIG. 26 is a drawing comparing the post-annealing FF of the photoelectric conversion element according to the comparative example and the post-annealing FF of the photoelectric conversion element according to the embodiment.

FIG. 25 is a drawing comparing the Voc after annealing of the photoelectric conversion element 99 and photoelectric conversion element 5. FIG. 26 is a drawing comparing the FF after annealing of the photoelectric conversion element 99 and photoelectric conversion element 5. In FIGS. 25 and 26, the outlined circle (○) indicates data for the photoelectric conversion element 99, and the solid triangle (▲) indicates data for the photoelectric conversion element 5. The vertical axis in FIGS. 25 and 26 are relative values that are normalized with the Voc and FF of each photoelectric conversion element after annealing at 150° C.

As illustrated in FIG. 25, the lowering amount of the Voc accompanying the rise in annealing temperature is reduced in the photoelectric conversion element 5, compared to the photoelectric conversion element 99. In the photoelectric conversion element 5, the lowering amount of the Voc is particularly low when the annealing temperature is 200° C. or higher. As illustrated in FIG. 26, the lowering amount of the FF accompanying the rise in annealing temperature is approximately the fame for the photoelectric conversion element 5 and photoelectric conversion element 99. Accordingly, the photoelectric conversion element 5 has little deterioration of the capacity accompanying the rise in annealing temperature compared to the photoelectric conversion element 99. That is, the photoelectric conversion element 5 has superior heat resistance compared to the photoelectric conversion element 99.

Figure 27:
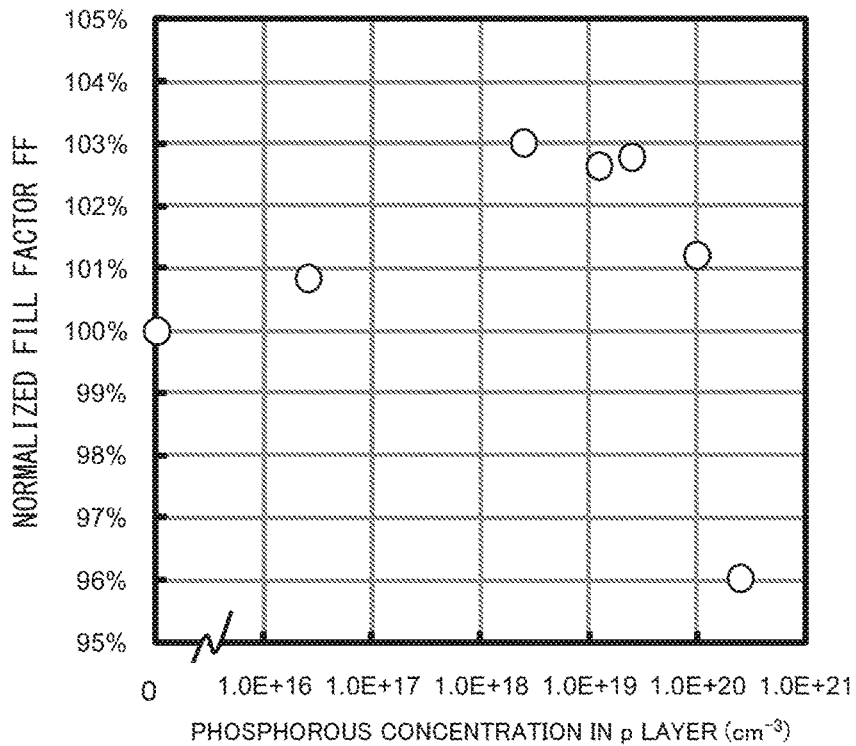
FIG. 27 is a graph illustrating changes in the FF of the photoelectric conversion element when the phosphorous concentration of the P-containing p layer changes.
Figure 28:
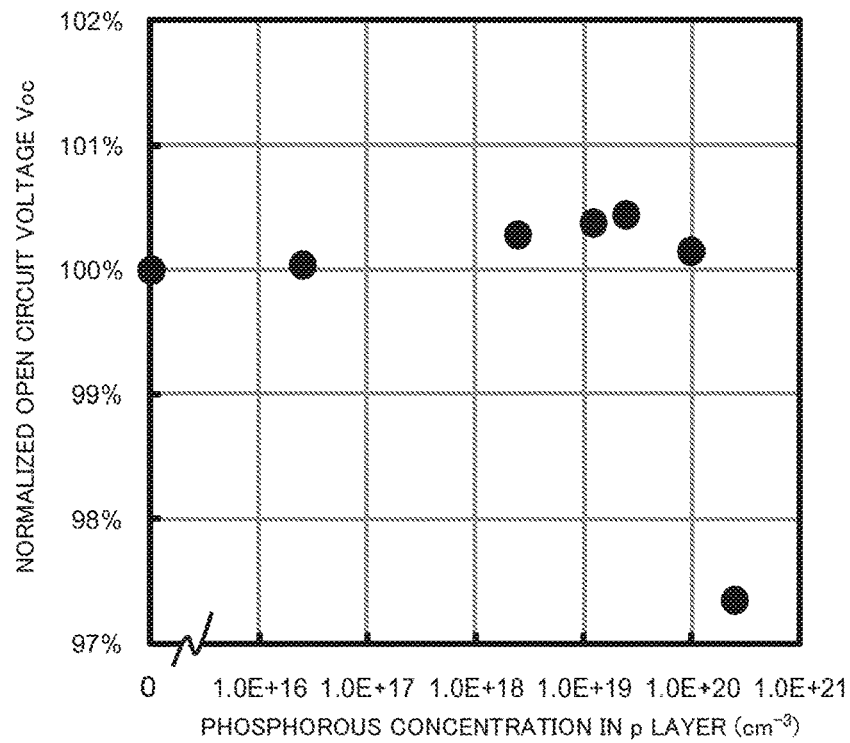
FIG. 28 is a graph illustrating changes in the Voc of the photoelectric conversion element when the phosphorous concentration of the P-containing p layer changes.

FIG. 27 is a graph illustrating changes in the FF of the photoelectric conversion element 5 when the phosphorous concentration of the P-containing p layer 522 changes. FIG. 28 is a graph illustrating changes in the Voc of the photoelectric conversion element 5 when the phosphorous concentration of the P-containing p layer 522 changes. The boron concentration of the p layer 521 and the P-containing p layer 522 is $5 \times 10^{20}$ cm$^{-3}$. The values on the vertical axis in FIGS. 27 and 28 are relative values that are normalized with the values when the phosphorous concentration in the P-containing p layer 522 is made 0.

As illustrated in FIG. 27, if the phosphorous content of the P-containing p layer 522 is $2 \times 10^{16}$ to $1 \times 10^{20}$ cm$^{-3}$, it is possible for the FF to be improved compared to a case where the phosphorous concentration is 0, that is, a case where there is no P-containing p layer 522. As illustrated in FIG. 28, the Voc is substantially unchanged with the phosphorous concentration of the P-containing p layer 522 in a range of $2 \times 10^{16}$ to $1 \times 10^{20}$ cm$^{-3}$, compared to a case where the phosphorous is 0, or is slightly improved. Accordingly, it is possible for the conversion efficiency determined by η=Jsc× Voc×FF to be improved as long as the phosphorous concentration of the P-containing p layer 522 is $2 \times 10^{16}$ to $1 \times 10^{20}$ cm$^{-3}$. Meanwhile, when the phosphorous concentration of the P-containing p layer 522 becomes greater than $1 \times 10^{20}$ cm$^{-3}$, the resistance value increases and the Voc lowers because the P-containing p layer 522 changes to n conductivity.

The phosphorous concentration of the P-containing p layer 522 is preferably $2 \times 10^{18}$ to $2 \times 10^{19}$ cm$^{-3}$. As illustrated in FIG. 27, it is possible for the Voc to be maintained or improved and the FF to be remarkably improved as long as the phosphorous concentration of the P-containing p layer 522 is $2 \times 10^{18}$ to $2 \times 10^{19}$ cm$^{-3}$. As a result, it is possible for the conversion efficiency to be remarkably improved.

Above, the fifth embodiment of the invention is described. In the embodiment, a case where the intrinsic amorphous layer 13 and the n-type amorphous layer 14 are formed on the surface 10a of the substrate 10 is described. However, the intrinsic amorphous layer 13 need not be included. An n+ layer in which a high concentration of n-type carrier is diffused into the substrate 10 may be formed instead of n-type amorphous layer 14.

In the embodiment, although a case where the surface of the side on which the n-type amorphous layer 14 is formed is the light receiving surface is described, the surface of the side on which the p-type amorphous layer 12 is formed may be the light receiving surface. In this case, the electrode 17 may be made in the form of a fine line. In the embodiment, although a case where the substrate 10 is a single crystal silicon substrate is described, the substrate 10 may be a polycrystalline silicon substrate.

In the embodiment, although a case where the conductivity type of the substrate 10 is n-type is described, the conductivity type of the substrate 10 may be p-type.

In the embodiment, although a case where the p-type dopant is boron and the n-type dopant is phosphorous, the type of dopant is not limited thereto. For example, the p-type dopant may be aluminum, and the n-type dopant may be arsenic.

Sixth Embodiment

Figure 29:
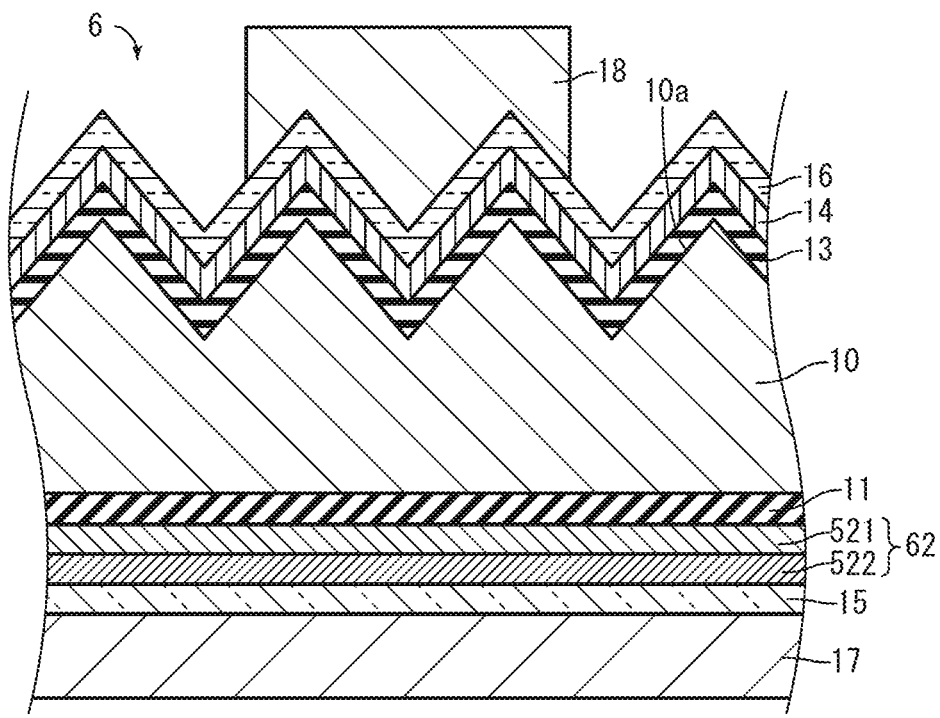
FIG. 29 is a cross-sectional view schematically illustrating a configuration of a photoelectric conversion element according to a sixth embodiment of the invention.

FIG. 29 is a cross-sectional view schematically illustrating a configuration of the photoelectric conversion element 6 according to the sixth embodiment of the invention. The photoelectric conversion element 6 is provided with a p-type amorphous layer 62 instead of the p-type amorphous layer 52 of the photoelectric conversion element 5.

The p-type amorphous layer 62 has a different stacking order of the p layer 521 and the P-containing p layer 522, compared to the p-type amorphous layer 52. In the embodiment, the p layer 521 and P-containing p layer 522 are formed in the order of p layer 521 and P-containing p layer 522 from the substrate 10 side. That is, the P-containing p layer 522 is formed to contact the transparent conductive film 15.

It is possible to manufacture the photoelectric conversion element 6 similarly to the photoelectric conversion element 5.

According to the embodiment, diffusion of the dopant from the p layer 521 into the transparent conductive film 15 is suppressed by the P-containing p layer 522. Accordingly, an increase in the recombination level in the transparent conductive film 15. Therefore, the photoelectric conversion element 6 has superior conversion efficiency and heat resistance.

Seventh Embodiment

Figure 30:
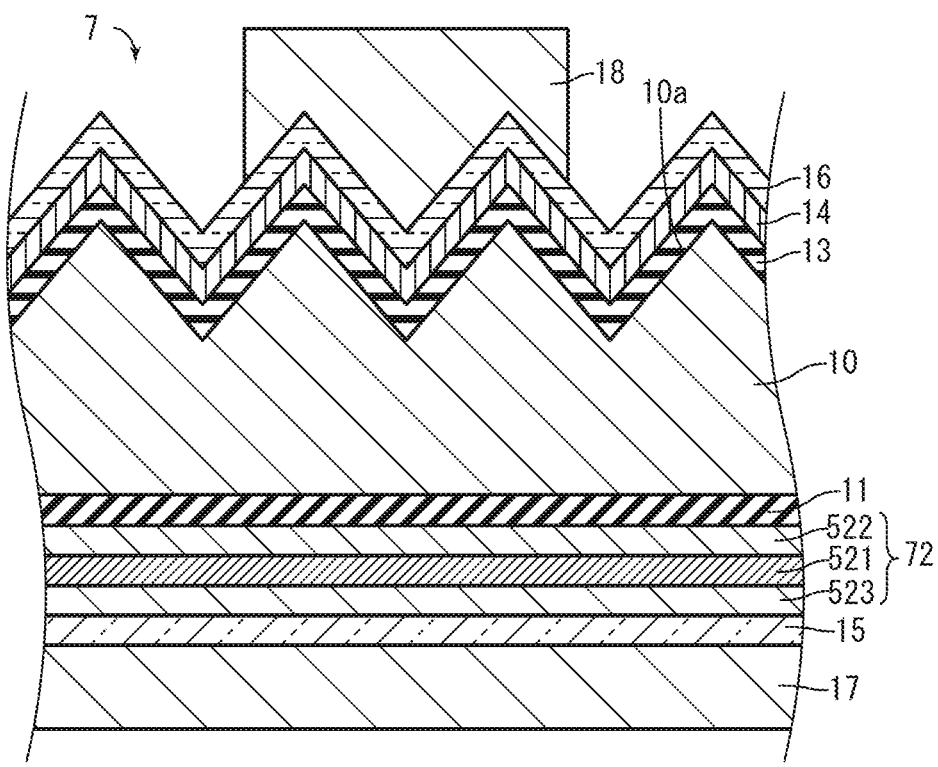
FIG. 30 is a cross-sectional view schematically illustrating a configuration of a photoelectric conversion element according to a seventh embodiment of the invention.

FIG. 30 is a cross-sectional view schematically illustrating a configuration of the photoelectric conversion element 7 according to the seventh embodiment of the invention. The photoelectric conversion element 7 is provided with a p-type amorphous layer 72 instead of the p-type amorphous layer 52 of the photoelectric conversion element 5.

The p-type amorphous layer 72 further includes a P-containing p layer 523 (third concentration layer) instead of the p layer 521 and P-containing p layer 522. The P-containing p layer 523 contains both boron and phosphorous as dopants, similarly to the P-containing p layer 522. The boron concentration of the P-containing p layer 523 is $1\times10^{20}$ to $1\times10^{21}$ cm$^{-3}$, similarly to the boron concentration of the P-containing p layer 522. The phosphorous concentration of the P-containing p layer 523 is $2\times10^{16}$ to $1\times10^{20}$ cm$^{-3}$, similarly to the phosphorous concentration of the P-containing p layer 522.

The p layer 521, P-containing p layer 522, and the P-containing p layer 523 are formed in the order of P-containing p layer 522, p layer 521, and P-containing p layer 523 from the substrate 10 side. That is, the P-containing p layer 522 is formed to contact the intrinsic amorphous layer 11, and the P-containing p layer 523 is formed to contact the conductive film 15.

It is possible to manufacture the photoelectric conversion element 7 similarly to the photoelectric conversion element 5.

According to the embodiment, the diffusion of the dopant from the p layer 521 into the intrinsic amorphous layer 11 is suppressed by the P-containing p layer 522, and the diffusion of the dopant from the p layer 521 into the transparent conductive film 15 is suppressed by the P-containing p layer 523. Therefore, the photoelectric conversion element 7 has superior conversion efficiency and heat resistance.

Eighth Embodiment

Figure 31:
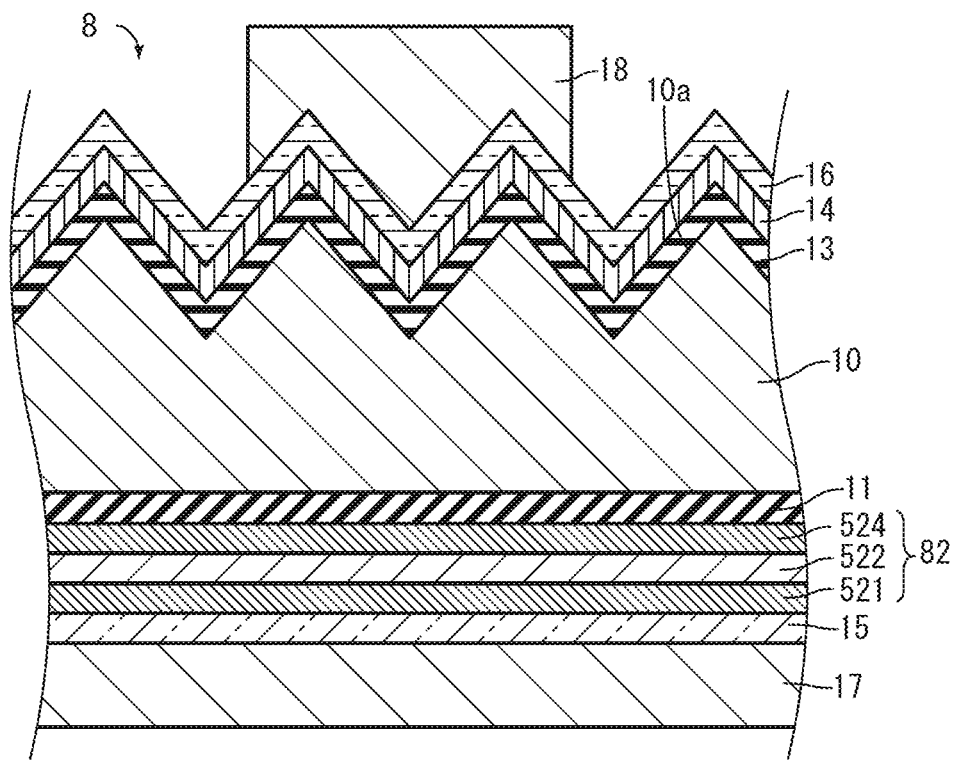
FIG. 31 is a cross-sectional view schematically illustrating a configuration of a photoelectric conversion element according to an eighth embodiment of the invention.

FIG. 31 is a cross-sectional view schematically illustrating a configuration of the photoelectric conversion element 8 according to the eighth embodiment of the invention. The photoelectric conversion element 8 is provided with a p-type amorphous layer 82 instead of the p-type amorphous layer 52 of the photoelectric conversion element 5.

The p-type amorphous layer 82 further includes a p layer 524 in addition to the p layer 521 and P-containing p layer 522. The p layer 524 contains $1\times10^{19}$ to $1\times10^{21}$ cm$^{-3}$ of boron as a dopant, similarly to the p layer 521.

The p layer 521, P-containing p layer 522, and the p layer 524 are formed in the order of p layer 524, P-containing p layer 522, and p layer 521 from the substrate 10 side. That is, the p layer 524 is formed to contact the intrinsic amorphous layer 11, and the p layer 521 is formed to contact the conductive film 15. The boron concentration of the p layer 524 is set to the optimal concentration for causing built-in potential between the substrate 10 and the p layer 524 to increase and reducing the contact resistance with the intrinsic amorphous layer 11, and the boron concentration of the p layer 521 is set to the optimal concentration for reducing the contact resistance with the transparent conductive film 15.

It is possible to manufacture the photoelectric conversion element 8 similarly to the photoelectric conversion element 1.

According to the embodiment, it is possible to suppress interdiffusion of the boron between the p layer 521 and the p layer 524 by the P-containing p layer 522. It is possible to reduce diffusion of the boron into the intrinsic amorphous film 11 and the transparent conductive film 15 by the boron of the p layer 521 and the p layer 524 diffusing into the P-containing p layer 522. Therefore, the photoelectric conversion element 8 has superior conversion efficiency and heat resistance.

Ninth Embodiment

Figure 32:
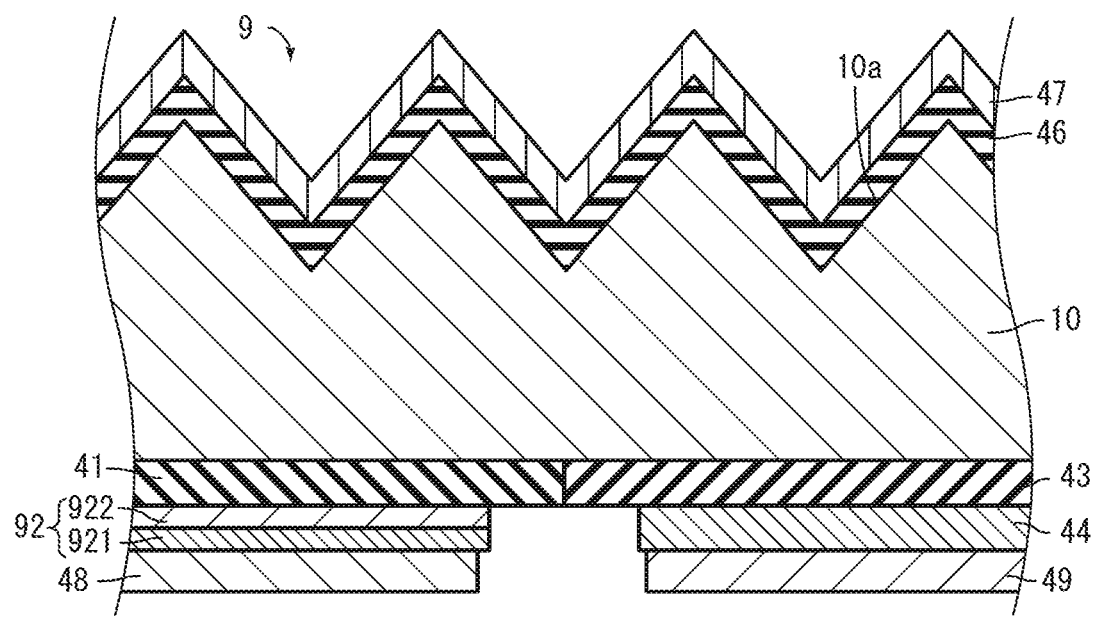
FIG. 32 is a cross-sectional view schematically illustrating a configuration of a photoelectric conversion element according to a ninth embodiment of the invention.

FIG. 32 is a cross-sectional view schematically illustrating a configuration of the photoelectric conversion element 9 according to the ninth embodiment of the invention. The photoelectric conversion element 9 is provided with a p-type amorphous layer 92 instead of the p-type amorphous layer 42 of the photoelectric conversion element 4.

The p-type amorphous layer 92 is a film of an amorphous semiconductor that has a p-type conductivity type and that contains hydrogen, similarly to the p-type amorphous layer 52. The p-type amorphous layer 92 includes a p layer 921 and P-containing p layer 922 (second concentration layer) that are stacked. In the embodiment, the p layer 921 and the P-containing p layer 922 are formed in the order of the P-containing p layer 922 and p layer 921 from the substrate 10 side. That is, the P-containing p layer 922 is formed to contact the intrinsic amorphous layer 41.

In the embodiment, although a case where a texture 10a is formed on one surface of the substrate 10 is described, the texture may be formed on both surfaces of the substrate 10.

It is possible to manufacture the photoelectric conversion element 9 similarly to the photoelectric conversion element 4.

[Effects of Photoelectric Conversion Element 9]

Also according to the embodiment, diffusion of the dopant from the p layer 921 into the intrinsic amorphous layer 41 is suppressed by the P-containing p layer 922. Therefore, the photoelectric conversion element 9 has superior conversion efficiency and heat resistance.

According to the embodiment, it is possible for the FF to be improved while maintaining the Voc by using the P-containing p layer 922. Because the deterioration of the capacity accompanying the rise in annealing temperature is low, the heat resistance is superior.

It should be noted that in the embodiment, the intrinsic amorphous layers 43 and 46 need not be present. An n$^+$ layer in which a high concentration of n-type carrier is diffused into the substrate 10 may be formed instead of light receiving surface n-type amorphous layer 47. The substrate 10 may be a polycrystalline silicon substrate, and the conductivity type may be p-type.

Also in the back surface bonding-type photoelectric conversion element such as exemplified by the ninth embodiment, it is possible to apply a configuration of various p-type amorphous layers exemplified in the fifth to eighth embodiments.

Modification Example of Ninth Embodiment

Figure 33:
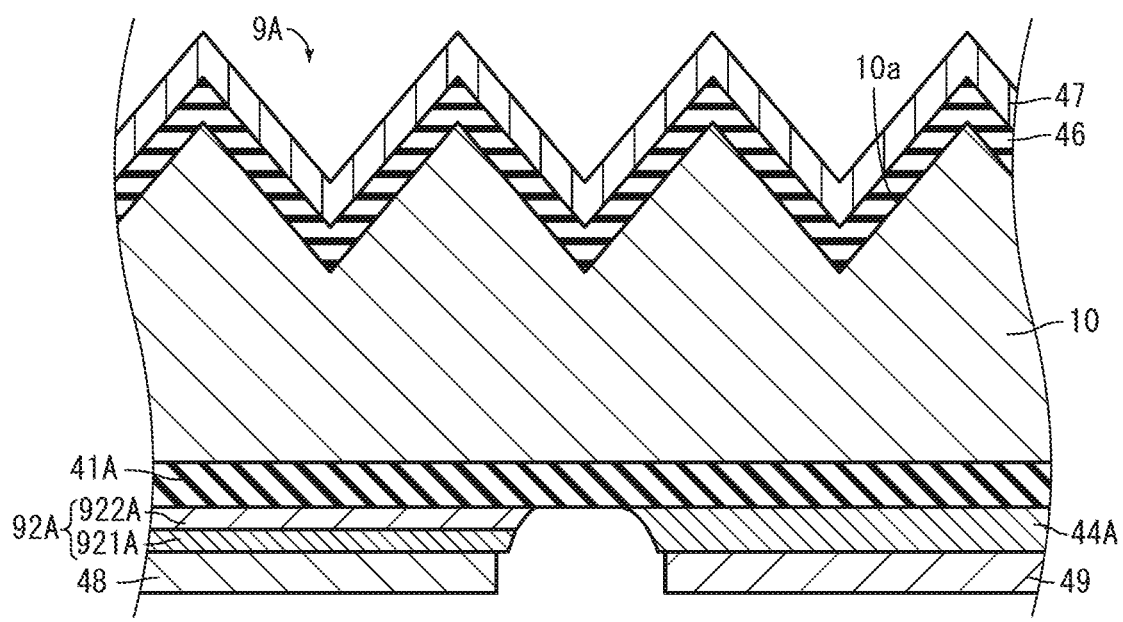
FIG. 33 is a cross-sectional view schematically illustrating a configuration of a photoelectric conversion element according to a modification example of the ninth embodiment of the invention.

FIG. 33 is a cross-sectional view schematically illustrating the configuration of a photoelectric conversion element 9A according to a modification example of the ninth embodiment. The photoelectric conversion element 9A is provided with an intrinsic amorphous layer 41A formed on substantially the entirety of one surface of the substrate 10, instead of the intrinsic amorphous layers 41 and 43 of the photoelectric conversion element 9. The photoelectric conversion element 9A is further provided with a p-type amorphous layer 92A and an n-type amorphous layer 44A instead of the p-type amorphous layer 92 and n-type amorphous layer 44, respectively.

The p-type amorphous layer 92A includes a p layer 921A and the P-containing p layer 922A that are stacked, similarly to the p-type amorphous layer 92.

It is possible to manufacture the photoelectric conversion element 9A similarly to the photoelectric conversion element 4A.

[Effects of Photoelectric Conversion Element 9]

Also according to the modification example, diffusion of the dopant from the p layer 921A into the intrinsic amorphous layer 41A is suppressed by the P-containing p layer 922A. Therefore, the photoelectric conversion element 9A has superior conversion efficiency and heat resistance.

It is possible to not perform the etching step by patterning using a mask, as illustrated in the modification example. Therefore, it is possible to manufacture the photoelectric conversion element 9A at low cost, compared to the photoelectric conversion element 9.

Similarly to the case of the photoelectric conversion element 4A, according to the modification example, it is possible to suppress the formation of a high boron concentration region in the gap region. The modification example has a suitably large diffusion prevention effect in a case where the texture is formed on both surfaces of the substrate 10.

Below, a photoelectric conversion module (tenth embodiment) provided with at least one photoelectric conversion element of the first to ninth embodiments or the modification example thereof and a solar power generation system (eleventh and twelfth embodiment) will be described as separate aspects of the invention.

Because the photoelectric conversion elements of the first to ninth embodiments or the modification example thereof have high conversion efficiency, it is possible for the photoelectric conversion module provided therewith and solar power generation system to also have a high conversion efficiency.

Tenth Embodiment

The tenth embodiment is a photoelectric conversion module that is provided with at least one photoelectric conversion element of the first to ninth embodiments and the modification example thereof.

<Photoelectric Conversion Module>

Figure 34:
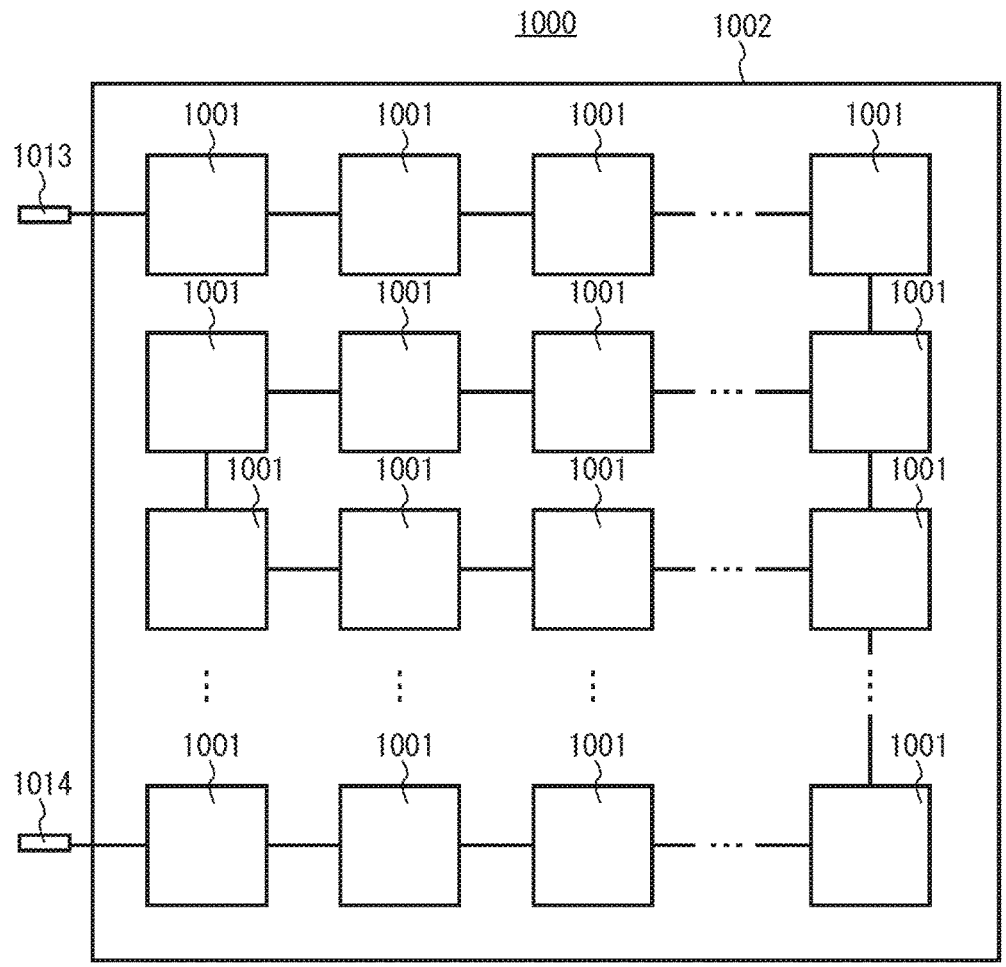
FIG. 34 is a schematic view illustrating an example of a configuration of a photoelectric conversion module according to an embodiment.

FIG. 34 is a schematic view illustrating an example of the configuration of the photoelectric conversion module according to the embodiment. With reference to FIG. 34, the photoelectric conversion module 1000 is provided with a plurality of photoelectric conversion elements 1001, a cover 1002, and output terminals 1013 and 1014.

The plurality of photoelectric conversion elements 1001 is arranged in an array form and connected in series. Although FIG. 34 illustrates an arrangement in which the photoelectric conversion elements 1001 are connected in series, the arrangement and connection format are not limited thereto, and the elements may be arranged connected in parallel, or may be arranged with series and parallel combined. Any one of the photoelectric conversion elements of the first to ninth embodiments and the modification example is used in the respective plurality of photoelectric conversion elements 1001. The photoelectric conversion module 1000 is able to have any configuration without being limited to the above description as long as at least one of the plurality of photoelectric conversion elements 1001 is any of the photoelectric conversion elements of the first to ninth embodiments and the modification example thereof. It is possible for the number of photoelectric conversion elements 1001 included in the photoelectric conversion module 1000 to be made an arbitrary integer of 2 or more.

The cover 1002 is formed of a weather resistant cover, and covers the plurality of photoelectric conversion elements 1001. The cover 1002 includes a transparent base material (for example, glass or the like) provided on the light receiving surface of the photoelectric conversion element 1001, a rear surface base material (for example, glass, resin sheet, or the like) provided on the rear surface side opposite to the light receiving surface side of the photoelectric conversion element 1001, and a sealing material (for example, EVA or the like) which covers the gap between the transparent base material and the resin base material.

The output terminal 1013 is connected to the photoelectric conversion element 1001 arranged at one end of the plurality of photoelectric conversion elements 1001 that are connected in series.

The output terminal 1014 is connected to the photoelectric conversion element 1001 arranged at the other end of the plurality of photoelectric conversion elements 1001 that are connected in series.

Eleventh Embodiment

The eleventh embodiment is a solar power generation system that is provided with at least one photoelectric conversion element of the first to ninth embodiments and the modification example thereof. Because the photoelectric conversion element of the invention has a high conversion efficiency, it is possible for the solar power generation system provided therewith to also have a high conversion efficiency. The solar power generation system converts, as appropriate, the power output by the photoelectric conversion module, and supplies the power to a commercial power system, an electrical apparatus, or the like.

<Solar Power Generation System>

Figure 35:
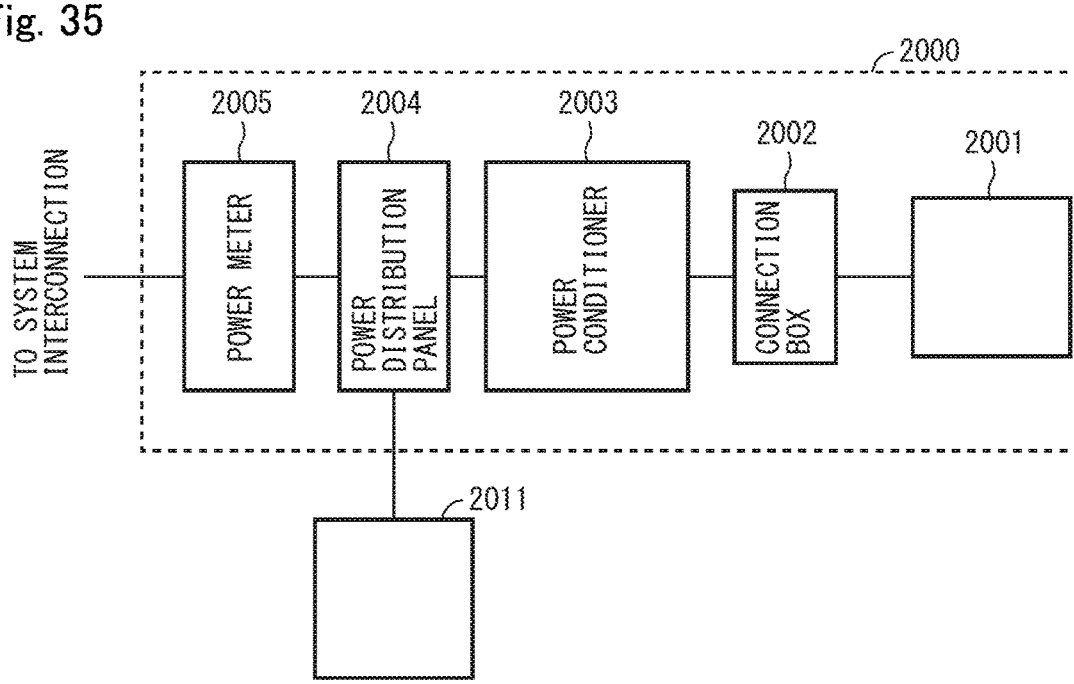
FIG. 35 is a schematic view illustrating an example of a configuration of a solar power generation system according to an embodiment.

FIG. 35 is a schematic view illustrating an example of a configuration of a solar power generation system according to the embodiment. With reference to FIG. 35, the solar power generation system 2000 is provided with a photoelectric conversion module array 2001, a connection box 2002, a power conditioner 2003, a power distribution panel 2004, and a power meter 2005. The photoelectric conversion module array 2001 is formed of a plurality of photoelectric conversion modules 1000 (tenth embodiment), as described later. Because the photoelectric conversion element of the invention has a high conversion efficiency, it is possible for the solar power generation system provided therewith to also have a high conversion efficiency.

In general, it is possible for functions referred to as a home energy management system (HEMS), a building energy management system (BEMS) or the like to be added to the solar power generation system 2000. Accordingly, it is possible to reduce the energy consumption by performing monitoring of the power generation amount of the solar power generation system 2000, monitoring and control of the power consumption amount of each electrical apparatus type connected to the solar power generation system 2000 and the like.

The connection box 2002 is connected to the photoelectric conversion module array 2001. The power conditioner 2003 is connected to the connection box 2002. The power distribution panel 2004 is connected to the power conditioner 2003 and the electrical apparatuses 2011. The power meter 2005 is connected to the power distribution panel 2004 and the commercial power system.

Figure 38:
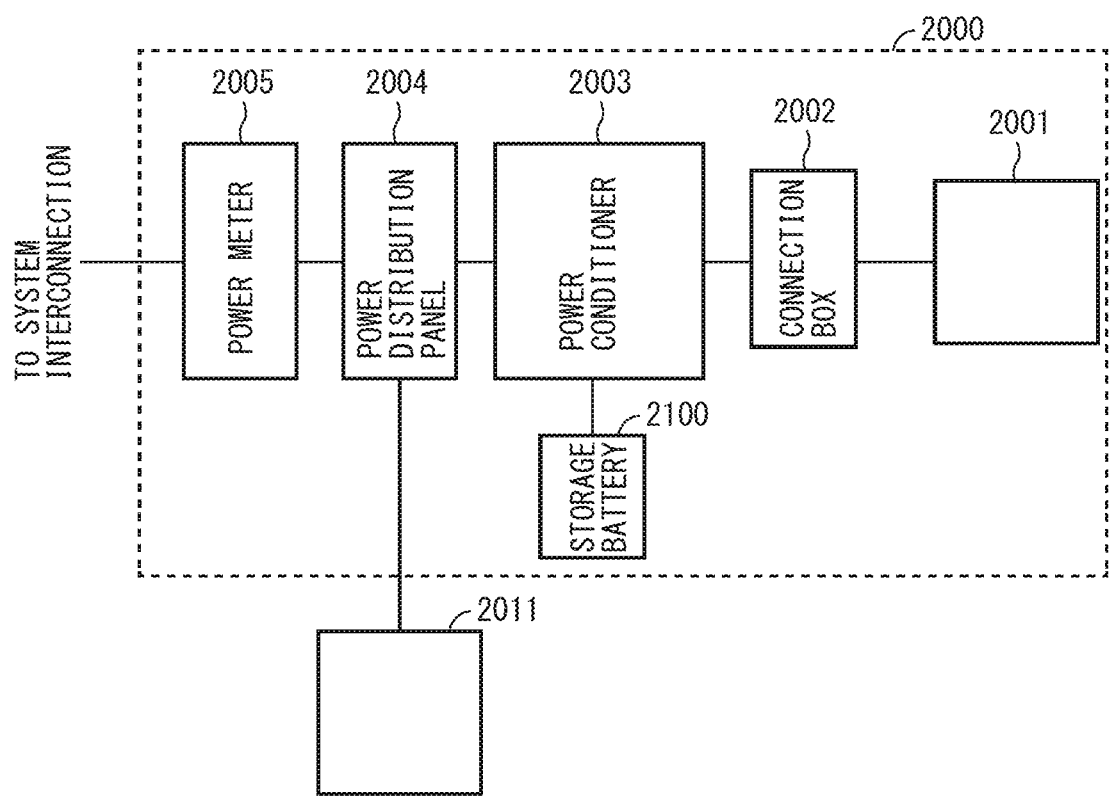
FIG. 38 is a schematic view illustrating still another example of the configuration of the solar power generation system according to the embodiment.

It should be noted that a storage battery 2100 may be connected to the power conditioner 2003 as illustrated in FIG. 38. In this case, it is possible to suppress output fluctuations due to fluctuations in the amount of sunlight, and it is possible to supply the power stored in the storage battery 2100 even during a time slot without sunlight. The storage battery 2100 may be built into the power conditioner 2003.

(Operation)

The operation of the solar power generation system 2000 will be described.

The photoelectric conversion module array 2001 converts solar light to electricity, thereby generating direct current power, and supplies the direct current power to the connection box 2002.

The power conditioner 2003 converts the direct current power received from the connection box 2002 to alternating current power and supplies the power to the power distribution panel 2004. It should be noted that a portion or all of the direct current power received from the connection box 2002 need not be converted to alternating current power, and may be supplied as unchanged direct current power to the power distribution panel 2004.

It should be noted that In a case where the storage battery 2100 is connected to the power conditioner 2003 as illustrated in FIG. 38 (or in a case where the storage battery 2100 is built into the power conditioner 2003), it is possible for the power conditioner 2003 to suitably convert a portion or all of the direct current power received from the connection box 2002 and to store the converted power in the storage battery 2100. The power stored in the storage battery 2100 is supplied to the power conditioner 2003 side, as appropriate, in response to the situation of the power generation amount of the photoelectric conversion module or the power consumption amount of the electrical apparatuses 2011, and is subjected to suitable power conversion and supplied to the power distribution panel 2004.

The power distribution panel 2004 supplies either of power received from the power conditioner 2003 or commercial power received via the power meter 2005 to the electrical apparatuses 2011. When more there is more alternating current power received from the power conditioner 2003 than power consumption by the electrical apparatuses 2011, the power distribution panel 2004 supplies the alternating current power received from the power conditioner 2003 to the electrical apparatuses 2011. The surplus alternating current power is supplied to the commercial power system via the power meter 2005.

When there is less alternating current power received from the power conditioner 2003 than power consumption by the electrical apparatuses 2011, the power distribution panel 2004 supplies the alternating current power received from the commercial power system and the alternating current power received from the power conditioner 2003 to the electrical apparatuses 2011.

The power meter 2005 measures the power in the direction from the commercial power system to the power distribution panel 2004 and measures the power in the direction from the power distribution panel 2004 to the commercial power system.

(Photoelectric Conversion Module Array)

The photoelectric conversion module array 2001 will be described.

Figure 36:
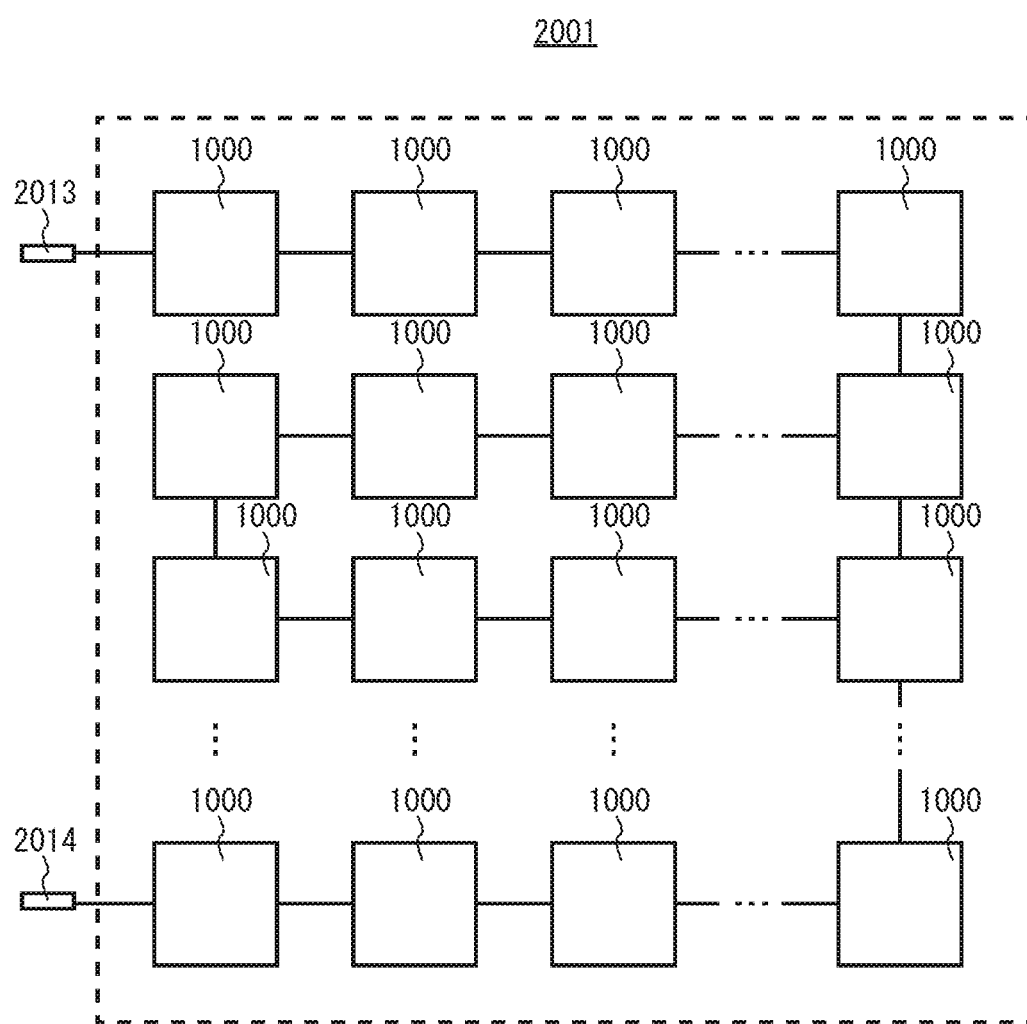
FIG. 36 is a schematic view illustrating an example of a configuration of a photoelectric conversion module array illustrated in FIG. 35.

FIG. 36 is a schematic view illustrating an example of the configuration of the photoelectric conversion module array 2001 illustrated in FIG. 35. With reference to FIG. 36, the photoelectric conversion module array 2001 is provided with a plurality of photoelectric conversion modules 1000, and output terminals 2013 and 2014.

The plurality of photoelectric conversion modules 1000 is arranged in an array form and connected in series. Although FIG. 36 illustrates an arrangement in which the photoelectric conversion modules 1000 are connected in series, the arrangement and connection format are not limited thereto, and the elements may be arranged connected in parallel, or may be arranged with series and parallel combined. It should be noted that it is possible for the number of photoelectric conversion modules 1000 included in the photoelectric conversion module array 2001 to be made an arbitrary integer of 2 or more.

The output terminal 2013 is connected to the photoelectric conversion module 1000 positioned at one end of the plurality of photoelectric conversion modules 1000 that are connected in series.

The output terminal 2014 is connected to the photoelectric conversion module 1000 positioned at the other end of the plurality of photoelectric conversion modules 1000 that are connected in series.

It should be noted that the above description is merely an example, and as long as the solar power generation system of the embodiments is formed of any of the photoelectric conversion elements of the first to ninth embodiments and the modification example thereof from the plurality of photoelectric conversion elements 1001, any configuration is possible without being limited to the above description.

Twelfth Embodiment

The twelfth embodiment is a larger scale solar power generation system than the solar power generation system described as the eleventh embodiment. The solar power generation system according to the twelfth embodiment is also provided with at least one photoelectric conversion element of the first to ninth embodiments and the modification example thereof. Because the photoelectric conversion element of the invention has a high conversion efficiency, it is possible for the solar power generation system provided therewith to also have a high conversion efficiency.

<Large Scale Solar Power Generation System>

Figure 37:
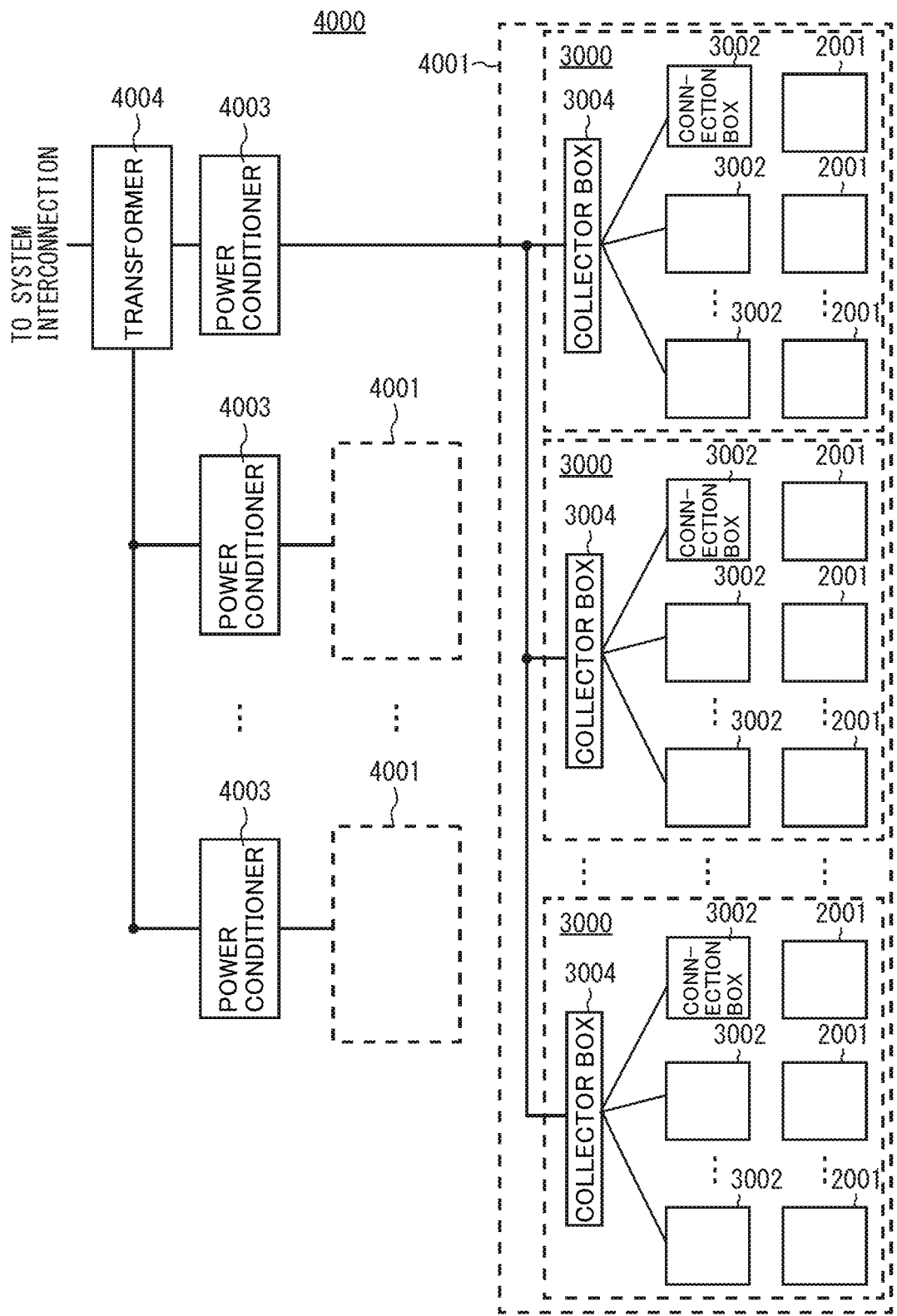
FIG. 37 is a schematic view illustrating another example of the configuration of the solar power generation system according to the embodiment.

FIG. 37 is a schematic view illustrating another example of the configuration of the solar power generation system according to the embodiment. With reference to FIG. 37, the solar power generation system 4000 is provided with a plurality of subsystems 4001, a plurality of power conditioners 4003, and a transformer 4004. The solar power generation system 4000 is a larger scale solar power generation system than the solar power generation system 2000 illustrated in FIG. 35. Because the photoelectric conversion element of the invention has a high conversion efficiency, it is possible for the solar power generation system provided therewith to also have a high conversion efficiency.

A plurality of power conditioners 4003 are connected to the respective subsystems 4001. It is possible for the number of power conditioners 4003 and subsystems 4001 connected thereto in the solar power generation system 4000 to be made an arbitrary integer of two or more.

Figure 39:
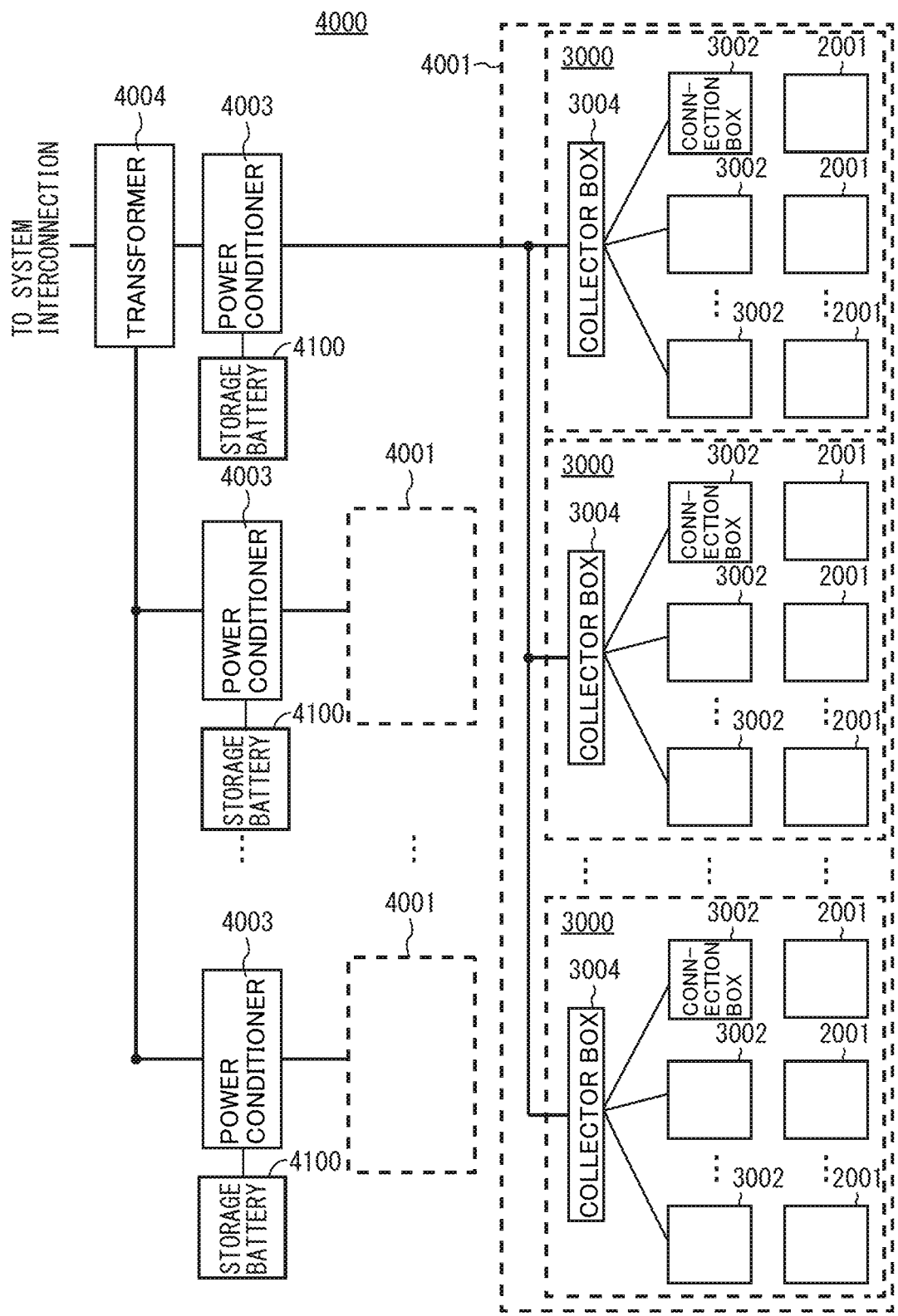
FIG. 39 is a schematic view illustrating still another example of the configuration of the solar power generation system according to the embodiment.

It should be noted that a storage battery 4100 may be connected to the power conditioner 4003 as illustrated in FIG. 39. In this case, it is possible to suppress output fluctuations due to fluctuations in the amount of sunlight, and it is possible to supply the power stored in the storage battery 4100 even during a time slot without sunlight. The storage battery 4100 may be built into the power conditioner 4003.

The transformer 4004 is connected to the plurality of power conditioners 4003 and a commercial power system.

Each of the plurality of subsystems 4001 is formed of a plurality of module systems 3000. It is possible to make the number of module systems 3000 in the subsystem 4001 an arbitrary integer of two or more.

Each of the plurality of module systems 3000 includes a plurality of photoelectric conversion module arrays 2001, a plurality of connection boxes 3002 and a collector box 3004. It is possible for the number of connection boxes 3002 in the module system 3000 and photoelectric conversion module arrays 2001 connected thereto to be made an arbitrary integer of two or more.

A collector box 3004 is connected to the plurality of connection boxes 3002. The power conditioner 4003 is connected to the plurality of collector boxes 3004 in the subsystem 4001.

(Operation)

The operation of the solar power generation system 4000 will be described.

The plurality of photoelectric conversion module arrays 2001 of the module system 3000 convert solar light to electricity, thereby generating direct current power, and supplies the direct current power to the collector box 3004 via the connection box 3002. The plurality of collector boxes 3004 in the subsystem 4001 supplies the direct current power to the power conditioner 4003. The plurality of power conditioners 4003 further convert the direct current power to alternating current power, and supply the alternating current power to the transformer 4004.

It should be noted that In a case where the storage battery 4100 is connected to the power conditioner 4003 as illustrated in FIG. 39 (or in a case where the storage battery 4100 is built into the power conditioner 4003), it is possible for the power conditioner 4003 to suitably convert a portion or all of the direct current power received from the collector box 3004, and to store the converted power in the storage battery 4100. The power stored in the storage battery 4100 is supplied, as appropriate to the power conditioner 4003 side in response to the power generation amount of the subsystem 4001, and supplies the power to the transformer 4004 while being suitably converted.

The transformer 4004 converts the voltage level of the alternating current power received from the plurality of power conditioners 4003 and supplies the converted power to a commercial power system.

It should be noted that as long as the solar power generation system 4000 is provided with at least one photoelectric conversion element of the first to ninth embodiments and the modification example thereof, it is not necessary that all of the photoelectric conversion elements included in the solar power generation system 4000 be photoelectric conversion elements of the first to ninth embodiments and the modification example thereof. For example, cases where all of the photoelectric conversion elements included in a given subsystem 4001 are any of photoelectric conversion elements of the first to ninth embodiments and the modification example thereof and a portion or all of the photoelectric conversion elements included in another subsystem 4001 are not photoelectric conversion elements of the first to ninth embodiments and the modification example thereof are conceivable.

Although embodiments of the invention as described above were described, the combination, as appropriate, of the configuration of each of the above-described embodiments is determined from the outset.

The photoelectric conversion device according to an embodiment of the invention is provided with a silicon substrate, a substantially intrinsic amorphous layer that is formed on one surface of the silicon substrate, and a first conductive amorphous layer that is formed on the intrinsic amorphous layer, and the first conductive amorphous layer includes a first concentration layer and a second concentration layer that is stacked on the first concentration layer. The dopant concentration of the second concentration layer is $8 \times 10^{17}$ cm$^{-3}$ or more, and is lower than the dopant concentration of the first concentration layer (first configuration).

According to the above-described configuration, the photoelectric conversion device is provided with a silicon substrate and a first conductive amorphous layer. An intrinsic amorphous layer is formed between the silicon substrate and the first conductive amorphous layer. The intrinsic amorphous layer suppresses the generation of a recombination level in the junction between the silicon substrate and the first conductive amorphous layer. The first conductive amorphous layer includes a second concentration layer that is stacked on the first concentration layer. The dopant concentration of the second concentration layer is lower than the dopant concentration of the first concentration layer. The diffusion of the dopant from the first concentration layer into another layer can be suppressed by the second concentration layer. The lowering of the shape factor can be suppressed by making the dopant concentration of the second concentration layer $8 \times 10^{17}$ cm$^{-3}$ or more. Thereby, the conversion efficiency of the photoelectric conversion device can be improved.

In the first configuration, a configuration may be used in which the dopant in the second concentration layer is boron (second configuration).

The photoelectric conversion device according to another embodiment of the invention is provided with a silicon substrate, a substantially intrinsic amorphous layer formed on one surface of the silicon substrate, and a first conductive amorphous layer that is formed on the intrinsic amorphous layer. The first conductive amorphous layer includes a first concentration layer and a second concentration layer that is stacked on the first concentration layer. The conductivity type of the first conductive amorphous layer is p-type and the second concentration layer contains a p-type dopant and an n-type dopant (third configuration).

According to the above-described configuration, the photoelectric conversion device is provided with a silicon substrate and a first conductive amorphous layer. An intrinsic amorphous layer is formed between the silicon substrate and the first conductive amorphous layer. The intrinsic amorphous layer suppresses the generation of a recombination level in the junction between the silicon substrate and the first conductive amorphous layer. The first conductive amorphous layer includes a second concentration layer that is stacked on the first concentration layer. The second concentration layer contains a p-type dopant and an n-type dopant. The diffusion of the dopant from the first concentration layer into another layer can be suppressed by the second concentration layer. Thereby, the conversion efficiency of the photoelectric conversion device can be improved.

In the third configuration, it is preferable that the concentration of the n-type dopant in the second concentration layer be $2 \times 10^{16}$ to $1 \times 10^{20}$ cm$^{-3}$ (fourth configuration).

In any of the first to fourth configurations, a configuration may be used in which the second concentration layer is formed on the intrinsic amorphous layer and the first concentration layer is formed on the second concentration layer (fifth configuration). According to the configuration, it is possible to suppress diffusion of the dopant in the first concentration layer into the intrinsic amorphous layer.

In any of the first to fourth configurations, a configuration may be used in which the photoelectric conversion device is further provided with a conductive film formed on the first conductive amorphous layer, in which the first concentration layer is formed on the intrinsic amorphous layer and the second concentration layer is formed on the first concentration layer (sixth configuration). According to the configuration, it is possible to suppress diffusion of the dopant in the first concentration layer into the conductive film.

In any of the first to sixth configurations, a configuration may be used in which the first conductive amorphous layer is stacked on the first concentration layer and the second concentration layer, and that further includes a third concentration layer that suppresses diffusion of the dopant in the first concentration layer (seventh configuration).

In the seventh configurations, a configuration may be used in which the photoelectric conversion device is further provided with a conductive film formed on the first conductive amorphous layer, in which the second concentration layer is formed on the intrinsic amorphous layer and the first concentration layer is formed on the second concentration layer, and the third concentration layer is formed on the first concentration layer (eighth configuration). According to the configuration, it is possible to suppress diffusion of the dopant in the first concentration layer into the intrinsic amorphous layer and the conductive layer.

A configuration may be used in which the photoelectric conversion device is further provided with a second conductive amorphous layer that is formed on the other surface of the silicon substrate and which has the opposite conductivity type to the first conductive amorphous layer (ninth configuration).

A configuration may be used in which the photoelectric conversion device is further provided with a second conductive amorphous layer that is one surface of the silicon substrate, that is formed adjacent to the first conductive amorphous layer in the in-plane direction of the silicon substrate, and that has the opposite conductivity type to the first conductive amorphous layer (tenth configuration).

The photoelectric conversion module according to an example of the invention is a photoelectric conversion module in which a photoelectric conversion device with any of the above configuration is used (eleventh configuration).

The solar power generation system according to an embodiment of the invention is a solar power generation system that includes the above photoelectric conversion module (twelfth configuration).

What is claimed is:

1. A photoelectric conversion device comprising:
   a silicon substrate;
   a substantially intrinsic amorphous layer that is formed on one surface of the silicon substrate; and
   a first conductive amorphous layer that is formed on the substantially intrinsic amorphous layer,
   wherein the first conductive amorphous layer includes a first concentration layer and a second concentration layer in direct physical contact with the first concentration layer, a conductivity type of the first conductive amorphous layer is p-type, and the second concentration layer is a p-type layer doped with a p-type dopant and an n-type dopant.

2. The photoelectric conversion device according to claim 1, wherein a concentration of the n-type dopant in the second concentration layer is $2 \times 10^{16}$ to $1 \times 10^{20}$ cm$^{-3}$.

3. The photoelectric conversion device according to claim 1, wherein the second concentration layer is formed on the substantially intrinsic amorphous layer, and the first concentration layer is formed on the second concentration layer.

4. The photoelectric conversion device according to claim 1, further comprising:
   a conductive film that is formed on the first conductive amorphous layer, wherein the first concentration layer is formed on the substantially intrinsic amorphous layer, and the second concentration layer is formed on the first concentration layer.

5. The photoelectric conversion device according to claim 1, wherein the first conductive amorphous layer further includes a third concentration layer that is stacked on the first concentration layer and the second concentration layer and that suppresses diffusion of the dopant in the first concentration layer.

* * * * *